(12) United States Patent
Yin et al.

(10) Patent No.: US 9,373,722 B2
(45) Date of Patent: Jun. 21, 2016

(54) SEMICONDUCTOR STRUCTURE AND METHOD FOR MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 17 days.

(21) Appl. No.: 14/395,076

(22) PCT Filed: May 10, 2012

(86) PCT No.: PCT/CN2012/075309
§ 371 (c)(1),
(2), (4) Date: Oct. 17, 2014

(87) PCT Pub. No.: WO2013/155740
PCT Pub. Date: Oct. 24, 2013

(65) Prior Publication Data
US 2015/0076603 A1    Mar. 19, 2015

(30) Foreign Application Priority Data

Apr. 19, 2012 (CN) .......................... 2012 1 0117033

(51) Int. Cl.
*H01L 29/78* (2006.01)
*H01L 21/266* (2006.01)
(Continued)

(52) U.S. Cl.
CPC ............ *H01L 29/785* (2013.01); *H01L 21/266* (2013.01); *H01L 21/84* (2013.01);
(Continued)

(58) Field of Classification Search
CPC ............ H01L 29/785; H01L 29/66795; H01L 29/66803; H01L 21/26586; H01L 29/7843; H01L 29/7848; H01L 29/7849; H01L 29/78612; H01L 21/823885; H01L 27/092; H01L 29/0895; H01L 29/165; H01L 29/42384
USPC .................. 257/347, E27.112, 369, E21.41, 257/E27.062, E29.262, 365, 401, E21.409, 257/E21.425, E21.632, E21.643, E29.042, 257/E29.068, E29.085, E29.137, E29.146, 257/E29.271, E29.274, 183, 192, 329, 331, 257/77; 438/283, 151, 157, 300, 156, 199
See application file for complete search history.

(56) References Cited

U.S. PATENT DOCUMENTS

| 5,904,535 A | * | 5/1999 | Lee | ...................... | H01L 21/8249 |
| | | | | | 257/E21.696 |
| 6,396,108 B1 | * | 5/2002 | Krivokapic | ........... | H01L 29/785 |
| | | | | | 257/365 |

(Continued)

FOREIGN PATENT DOCUMENTS

| CN | 1516287 A | 7/2004 |
| CN | 101131936 A | 2/2008 |
| CN | 101140888 A | 3/2008 |

OTHER PUBLICATIONS

International Search Report issued in PCT/CN2012/075309 mailed on Jan. 31, 2013 (6 pages).
Written Opinion of the International Searching Authority issued in PCT/CN2012/075309 mailed on Jan. 31, 2013 (4 pages).

*Primary Examiner* — Stephen W Smoot
*Assistant Examiner* — Edward Chin
(74) *Attorney, Agent, or Firm* — Osha Liang LLP

(57) ABSTRACT

The present invention provides a semiconductor structure comprising: a semiconductor base located on an insulating layer, wherein the insulating layer is located on a semiconductor substrate; source/drain regions, which are in contact with first sidewalls of the semiconductor base opposite to each other; gates located on second sidewalls of the semiconductor base opposite to each other; an insulating via located on the insulating layer and embedded into the semiconductor base; and an epitaxial layer sandwiched between the insulating via and the semiconductor base. The present invention further provides a method for manufacturing a semiconductor structure comprising: forming an insulating layer on a semiconductor substrate; forming a semiconductor base on the insulating layer; forming a void within the semiconductor base, wherein the void exposes the semiconductor substrate; forming an epitaxial layer in the void through selective epitaxy; and forming an insulating via within the void. Short-channel effects are significantly suppressed through forming super-steep retrograde well (SSRW).

37 Claims, 17 Drawing Sheets

(51) Int. Cl.
*H01L 29/06* (2006.01)
*H01L 29/16* (2006.01)
*H01L 29/161* (2006.01)
*H01L 29/66* (2006.01)
*H01L 21/84* (2006.01)
*H01L 27/12* (2006.01)
*H01L 21/265* (2006.01)
*H01L 29/165* (2006.01)

(52) U.S. Cl.
CPC ........ *H01L27/1203* (2013.01); *H01L 29/0649* (2013.01); *H01L 29/16* (2013.01); *H01L 29/161* (2013.01); *H01L 29/6656* (2013.01); *H01L 29/66795* (2013.01); *H01L 29/7842* (2013.01); *H01L 29/7843* (2013.01); *H01L 29/7848* (2013.01); *H01L 21/26586* (2013.01); *H01L 29/165* (2013.01)

(56) References Cited

U.S. PATENT DOCUMENTS

| | | | | |
|---|---|---|---|---|
| 6,610,576 B2* | 8/2003 | Nowak | ............. | H01L 29/66795 257/E29.283 |
| 6,727,546 B2* | 4/2004 | Krivokapic | ....... | H01L 29/42384 257/331 |
| 7,002,214 B1* | 2/2006 | Boyd | ............... | H01L 21/76283 257/347 |
| 8,461,650 B2* | 6/2013 | Zhu | .................. | H01L 29/66803 257/347 |
| 8,598,662 B2* | 12/2013 | Zhu | .................. | H01L 29/66795 257/347 |
| 8,896,062 B2* | 11/2014 | Zhu | .................. | H01L 29/66795 257/347 |
| 2005/0072988 A1* | 4/2005 | Augusto | ......... | H01L 21/823885 257/192 |
| 2006/0202266 A1 | 9/2006 | Radosavljevic et al. | | |
| 2012/0171833 A1* | 7/2012 | Zhu | .................. | H01L 29/66795 438/303 |

* cited by examiner

SEMICONDUCTOR STRUCTURE AND METHOD FOR MANUFACTURING THE SAME

CROSS REFERENCE TO RELATED APPLICATIONS

This application is a national stage application, filed under 35 U.S.C. §371, of PCT Application No. PCT/CN2012/075309, filed on May 10, 2012, entitled "SEMICONDUCTOR STRUCTURE AND METHOD FOR MANUFACTURING THE SAME", which claimed priority to Chinese Application No. 201210117033.5, filed on Apr. 19, 2012, all of which are hereby incorporated by reference in their entirety.

FIELD OF THE INVENTION

The present invention relates to semiconductor manufacturing field, particularly, to a semiconductor structure and a method for manufacturing the same.

BACKGROUND OF THE INVENTION

As channel lengths of Metal-Oxide-Semiconductor Field-Effect Transistors (MOSFET) are shortened unceasingly, a series of effects, which may have been ignored in MOSFET long channel models, now become increasingly remarkable and even become major factors that unfavorably affect device performance, and such phenomena are generally referred to as short-channel effects. Electrical properties of devices are deteriorated because of short-channel effects; for example, short-channel effects may cause decrease of gate threshold voltage, increase of power consumption and reduction of Signal-to-Noise Ratio (SNR).

In order to alleviate short-channel effects, Super-Steep Retrograde Well (SSRW) is now introduced into semiconductor FET devices. SSRW has a low-high-low (or low-high) channel doping profile, that is, surface regions of the channel have a low doping concentration, while highly doped regions are formed beneath the channel surfaces through ion implantation or other methods as appropriate, so as to reduce width of depletion regions at source/drain regions and, meanwhile, to suppress short-channel effects like increase of leakage arising from source/drain punch through and increase of threshold voltage. The U.S. patent numbered U.S. Pat. No. 7,002,214 has already disclosed super-steep retrograde well (SSRW) FET devices on ultra-thin body silicion on insulator (UTBSOI). As shown in FIG. 1, heavily doped SOI regions 33L/33R are formed on SOI through ion implantation, then ultra-thin intrinsic epitaxial regions 48L/48R are grown, so as to form super-steep retrograde doped channel profile and further to form an FET device. However, it is difficult to control doping profile through ion implantation; besides, it is also quite difficult to grow an epitaxial layer of high quality at a heavily doped region. The traditional SiGe PMOS stressed silicon technology also encounters up its bottleneck in development and thus is unlikely to provide stronger stress for channels anymore. Furthermore, bottleneck in development will soon be seen in respect to thickness of gate oxide dielectric, since the speed of thinning gate oxide has already fallen behind to the pace of reducing width of gates, consequently, gate dielectric leakage increases gradually; because critical dimension is downscaled constantly, thus it will easily give rise to continuous increase of resistance at source/drain regions and increase of power consumption of devices accordingly.

Nowadays, the dominant trend in the industry focuses on improving technologies of traditional planar devices, endeavoring to reduce thickness of channel regions and removing neutral regions at the bottom of depletion regions within the channel, such that the depletion regions in the channel are able to fill the channel regions completely—this is the so-called Fully Depleted (FD) device, whereas traditional planar devices are Partially Depleted (PD) devices.

However, silicon layers at channel regions must be very thin in order to manufacture FD devices. It is hard to manufacture a desired structure or it costs considerably high according to the traditional manufacturing process, especially, according to the traditional manufacturing process based on bulk silicon; it is still very hard to keep the thickness of silicon layers within the channel at a very thin level even in novel SOI (Silicon-on-Insulator) process. Therefore, on the basis of comprehensive thoughts of how to realize FD devices, the focus of research and development is shifted to three-dimensional device structures, i.e., to FD double-gate or tri-gate technologies.

Three-dimensional device structures (also referred to as vertical devices in some other articles) indicate devices whose cross-sectional planes of source/drain regions and cross-sectional planes of gates are not located on the same plane, which in essence are FinFET (Fin Field-Effect Transistor) structures.

In three-dimensional device structures, channel regions are separated from bulk silicon or SOI instead of being embraced therein, which thus makes it possible to manufacture very thin FD channels by means of etching or the like.

At present, the three-dimensional semiconductor device that has been proposed in the prior art is as shown in FIG. 2, which comprises a semiconductor base 020 located on an insulating layer 010, source and drain regions 030 in contact with first sidewalls 022 of the semiconductor base 020 opposite to each other, and gates 040 located on second sidewalls 024 adjacent to the first sidewalls 022 of the semiconductor base 020 (a gate dielectric layer and a work function metal layer sandwiched between the gate 040 and the semiconductor base 020 are not shown). Wherein, in order to reduce resistance at source and drain regions, the peripheries of the source and drain regions 030 may be extended; namely, the width of the source and drain regions 030 (in the XX' direction) is greater than the thickness of the semiconductor base 020. Three-dimensional semiconductor structures are expected to be applied in 22 nm technical node or below; however, along with further downscaling of device size, short-channel effects in three-dimensional devices will also become major factors that affect performance of the devices.

SUMMARY OF THE INVENTION

In one or more embodiments, the present invention provides a semiconductor structure and a method for manufacturing the same, which are favorable for suppressing short-channel effects and thereby improving device performance.

In one or more embodiments, the present invention provides a semiconductor structure comprising: a semiconductor base located on an insulating layer, wherein the insulating layer is located on a semiconductor substrate; source and drain regions in contact with first sidewalls of the semiconductor base opposite to each other; gates located on second sidewalls of the semiconductor base opposite to each other; an insulating via located on the insulating layer and embedded into the semiconductor base; and an epitaxial layer sandwiched between the insulating via and the semiconductor base.

In one or more embodiments, the present invention provides a method for manufacturing a semiconductor structure, comprising: forming an insulating layer on a semiconductor substrate; forming a semiconductor base on the insulating layer; forming source and drain regions in contact with first sidewalls of the semiconductor base opposite to each other; forming gates located on second sidewalls of the semiconductor base opposite to each other; removing part of the semiconductor base to form a void within the semiconductor base, wherein the void exposes the insulating layer; forming an epitaxial layer within the void through selective epitaxial method; and forming an insulating via in the void.

As compared to the prior art, the technical solutions proposed by embodiments of the present invention exhibit one or more of the following advantages:

It is favorable for thinning a depletion layer and further suppressing short-channel effects through forming a void in a semiconductor structure and forming a heavily doped epitaxial layer within the void by means of selective epitaxial method so as to form a Super-Steep Retrograde Well (SSRW);

Short-channel effects may be further suppressed by way of forming a void in a semiconductor base and embedding an insulating via so as to form an isolation region between source and drain regions; besides, the stress of the insulating via is adjusted, for example, PMOS devices exhibit a tensile stress and NMOS devices exhibit a compressive stress; the stress of the insulating via acts upon the semiconductor base, and accordingly will produce an opposite stress in the semiconductor base; namely, a compressive stress is produced in semiconductor bases of PMOS devices, and a tensile stress is produced in semiconductor bases of NMOS devices; and this is favorable for furthering adjusting stress in channel regions of devices, thereby further improving carrier mobility in channel regions;

The number of mask plates is reduced and thus the process is simplified, because the semiconductor base is formed by means of self-alignment with hard masks served by first sidewall spacers and second sidewall spacers, which are formed surrounding a sacrifice layer that is formed on a semiconductor layer located on the insulating layer;

Arranging the gates to be at least higher than the channel layer in a direction perpendicular to the semiconductor substrate is favorable for increasing effective areas at channel regions, which therefore further improves carrier mobility in channel region;

It is also favorable for providing stress uniformly by arranging the insulating via at least higher than the channel layer in a direction perpendicular to the semiconductor substrate;

A semiconductor auxiliary base is formed first, onto which the source and drain regions are formed then, wherein the source/drain regions may be formed through epitaxial method; therefore, when the material of the semiconductor auxiliary base comprises Si, the material of the source/drain regions may be $Si_{1-x}Ge_x$ for PMOS devices, and the material of the source/drain regions may be Si:C for NMOS devices; as a result, the source/drain regions are favorable for adjusting stress within channels, so as to improve carrier mobility in channel regions;

If epitaxial method is applied to form the source/drain regions, it is essential to form firstly the source/drain base layers (wafer seed layers, which may be part of the first semiconductor layer); after formation of the source/drain base layers, part of first sidewalls of the semiconductor base shall be exposed. Accordingly, ion implantation may be performed in a direction perpendicular to the first sidewalls, so as to form doped regions (e.g. diffusion regions and Halo regions) within channel regions of devices; this is easy to practice and also is favorable for shortening distance between neighboring semiconductor bases, which accordingly reduces areas of devices utilized, thereby reducing manufacturing cost.

BRIEF DESCRIPTION OF THE DRAWINGS

Other characteristics, objectives and advantages of the present invention are made more evident according to perusal of the following detailed description of exemplary embodiment(s) in conjunction with accompanying drawings; wherein same or similar reference signs in the drawings denote same or similar elements.

The following cross-sectional views are resulted from structures sectioned along a section line (AA' or BB') shown in the top views.

DETAILED DESCRIPTION OF THE INVENTION

Figure 1:
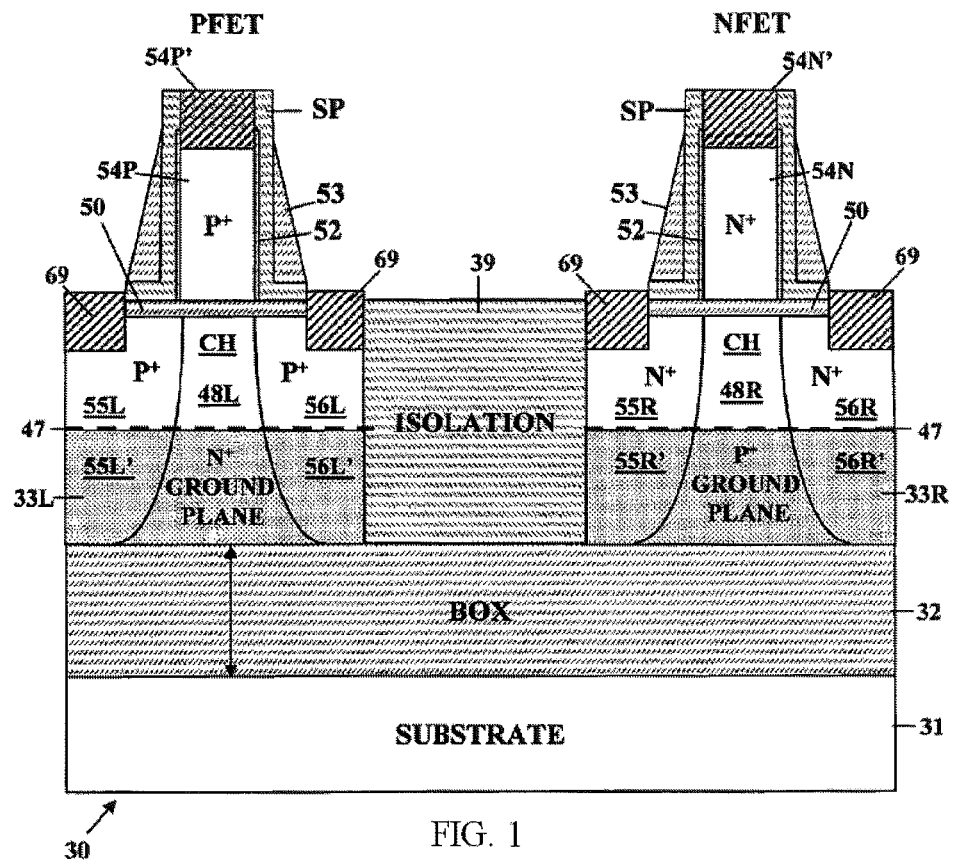
FIG. 1 illustrates a diagram of a semiconductor structure of the U.S. Pat. No. 7,002,214.
Figure 2:
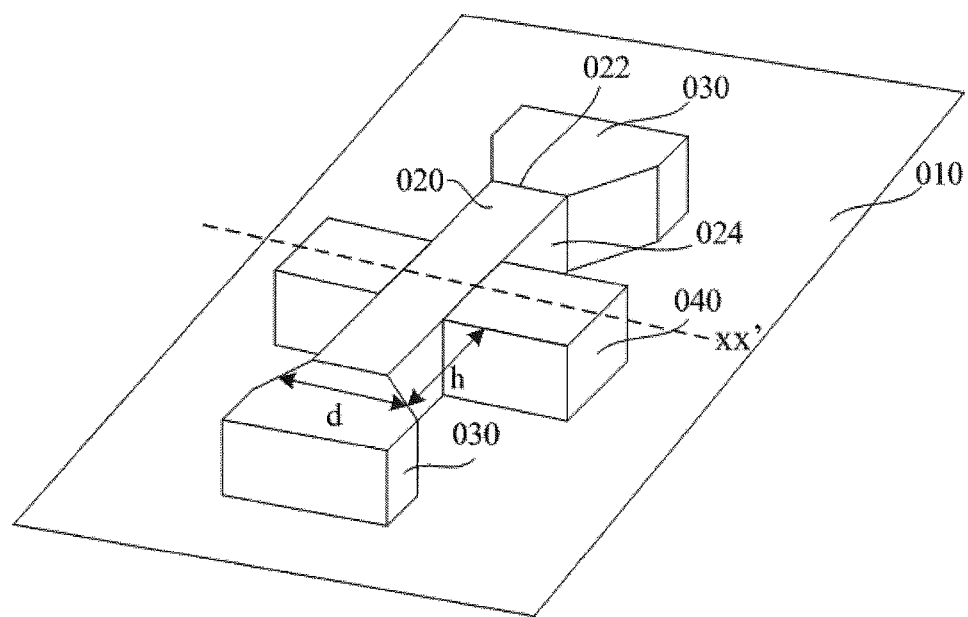
FIG. 2 illustrates a diagram of a semiconductor structure in the prior art.

The objectives, technical solutions and advantages of the present invention are made more evident according to the following detailed description of exemplary embodiments in conjunction with the accompanying drawings.

Embodiments of the present invention are described at length below, wherein examples of the embodiments are illustrated in the drawings, in which same or similar reference signs throughout denote same or similar elements or elements have same or similar functions. It should be appreciated that embodiments described below in conjunction with the drawings are illustrative, and are provided for explaining the prevent invention only, thus shall not be interpreted as a limit to the present invention.

Various embodiments or examples are provided here below to implement different structures of the present invention. To simplify the disclosure of the present invention, descriptions of components and arrangements of specific examples are given below. Of course, they are only illustrative and not limiting the present invention. Moreover, in the present invention, reference numbers and/or letters may be repeated in different examples. Such repetition is for purposes of simplicity and clarity, yet does not denote any relationship between respective embodiments and/or arrangements being discussed. Furthermore, the present invention provides various examples for various processes and materials. However, it is obvious for a person of ordinary skill in the art that other processes and/or materials may be alternatively utilized. In addition, following structures where a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other. The relationship of the various structures presented herein includes any essential extension made according to needs of processes or manufacturing, for example, the term "perpendicular" indicates that the difference between an angle of two planes and 90 degrees is in the range of permitted technical or manufacturing error.

Figure 3:
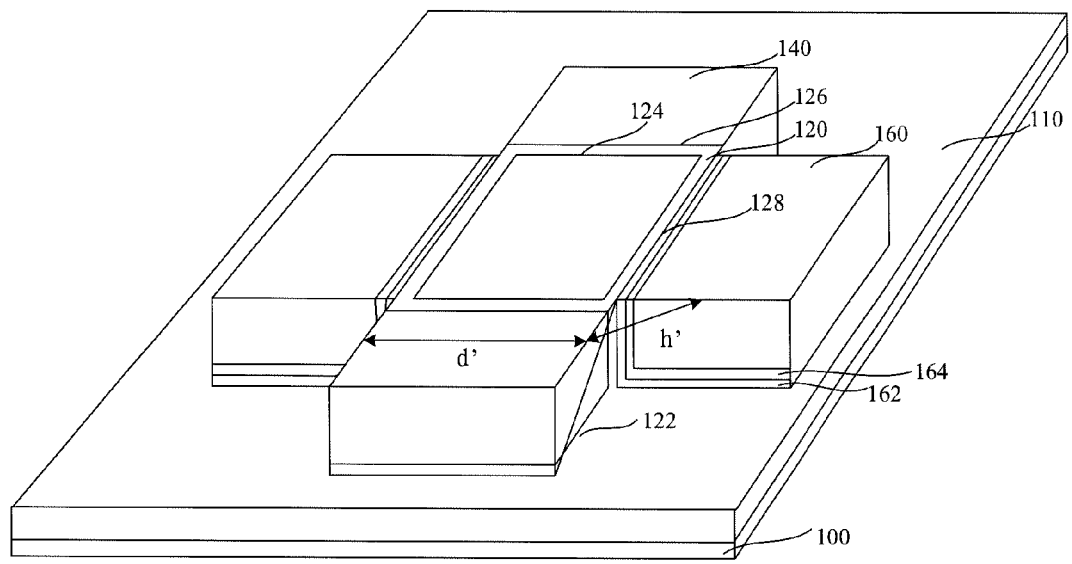
FIG. 3 illustrates a three-dimensional diagram of a semiconductor structure provided according to an embodiment of the present invention.

As shown in FIG. 3, the present application provides a semiconductor structure, comprising: a semiconductor base 120, which is located on an insulating layer 110, wherein the insulating layer 110 is located on a semiconductor substrate 100; source/drain regions 140 in contact with first sidewalls 126 of the semiconductor base 120 opposite to each other; gates 160 located on second sidewalls 128 of the semiconductor base 120 opposite to each other; an insulating via 124 located on the insulating layer 110 and embedded into the semiconductor base 120; and an epitaxial layer (not shown) located above the insulating layer 110 and sandwiched between the insulating via 124 and the semiconductor base 120.

The epitaxial layer, together with part of the semiconductor base 120 located at the second sidewalls 128, forms a super-steep retrograde doping channel profile, which is favorable for alleviating short-channel effects of semiconductor devices and thereby enhancing performance of devices. The insulating via 124, which is embedded into the semiconductor base 120, is capable of increasing distances among respective gates 160 formed on second sidewalls 128 of the semiconductor base 120, along with providing channel regions of the same thickness as compared to the prior art, such that the distance h' between the gate 160 and the source/drain regions 140 is increased, which is favorable for reducing parasitic capacitance. Additionally, provided that the semiconductor base 120 has the same height as that in the prior art, the peripheral area of the semiconductor base 120 with channels of the same thickness is increased in contrast to the prior art, such that the sectional area of the source/drain regions 140 in contact with the semiconductor base 120 is increased accordingly (because width d' of the source/drain regions 140 is increased), which therefore is favorable for further reducing resistance of the source/drain regions 140; furthermore, isolation regions, which are formed between the source/drain regions 140 through forming a void in the semiconductor base 120 and embedding the insulating via 124, are favorable for alleviating short-channel effects. Additionally, the stress of the insulating via 124 is adjusted, for instance, the insulating via 124 in a PMOS device exhibits a tensile stress, and the insulating via 124 in an NMOS device exhibits a compressive stress, the stress of the insulating via 124 acts upon the semiconductor base 120 and will produce an opposite stress in the semiconductor base 120; namely, a compressive stress is produced in the semiconductor base 120 of the PMOS device, and a tensile stress is produced in the semiconductor base 120 of the NMOS device; thus it is favorable for further adjusting the stress in channel regions thereof, so as to further improve carrier mobility inside channel regions.

Wherein, the semiconductor base 120 may be silicon formed on an insulating layer 110; doped regions (e.g. diffusion regions and halo regions) have already been formed in the semiconductor base 120 in order to provide a channel region for the device; in an embodiment of the semiconductor structure, a channel layer is sandwiched between the second sidewall 128 and the epitaxial layer, and a mask layer is sandwiched between the second sidewall 128 and the insulating via 124; the channel layer is sandwiched between the insulating layer 110 and the mask layer in a direction perpendicular to the semiconductor substrate 100; in this case, the material of the channel layer may be silicon (which has already formed the doped region); the thickness of the channel layer may be 5 nm~40 nm in a direction perpendicular to the second sidewalls. The material of the mask layer may be $Si_3N_4$, or stacked $SiO_2$ and $Si_3N_4$. The channel layer and the epitaxial layer have the same doping type, and the doping concentration of the epitaxial layer is greater than that of the channel layer, so as to form a super-steep retrograde channel profile. Wherein, the first sidewalls may be perpendicular to the second sidewalls.

The material of the semiconductor substrate 100 may be silicon; in a direction perpendicular to the semiconductor substrate 100, the insulating via 124 is at least higher than the channel layer, which is favorable for providing stress uniformly to the channel region. The insulating via 124 may comprise a material selected from a group consisting of $Si_3N_4$ and $SiO_2$, $SiO_xN_y$, or combinations thereof.

The semiconductor structure further comprises a semiconductor auxiliary base 122, which is in contact with the first sidewalls 126; and the source/drain regions 140 may be formed on the semiconductor auxiliary base 122. For exemplary purpose, the material of the semiconductor auxiliary base 122 also may be Si; in this case, the source/drain regions 140 may be formed on the semiconductor auxiliary base 122 through ion implantation process. Besides, the upper surface of the semiconductor auxiliary base 122 may be lower than the upper surface of the semiconductor base 120; herein, the term "upper surface" indicates the sidewall of the semiconductor auxiliary base 122, the semiconductor base 120 or the semiconductor substrate 100 that is parallel to the insulating layer 110. In this case, the source and drain regions 140 may be formed on the semiconductor auxiliary base 122 by means of epitaxial method. When the semiconductor auxiliary base 122 comprises Si, for PMOS devices, the material of the source/drain regions 140 may be $Si_{1-X}Ge_X$ (the value of X is selected from the range of 0.1~0.7, which may be adjusted flexibly in view of practical needs, for example, 0.2, 0.3, 0.4, 0.5 or 0.6; herein, in order not to obscure, the value of X complies with aforesaid values unless otherwise specified), for NMOS devices, the material of the source/drain regions 140 may be Si:C (the percentage of C atoms may be 0.2%~2%, for example, 0.5%, 1% or 1.5%; wherein the volume of C may be adjusted flexibly in view of manufacturing needs; herein, in order not to obscure, the percentage of C atoms complies with aforesaid values unless otherwise specified). In this way, the stress in channel regions may be favorably regulated further using the source/drain regions 140, so as to improve carrier mobility inside channel regions.

The gates 160 may be formed on the second sidewalls 128 through stacking a gate dielectric layer 162 and a work function metal layer 164; the gate dielectric layer 162 may be made of a hafnium-based material selected, for example, from a group consisting of $HfO_2$, HfSiO, HfSiON, HfTaO, HfTiO and HfZrO or combinations thereof, or may be a material selected from a group consisting of $Al_2O_3$, $La_2O_3$, $ZrO_2$, $SiO_2$ and $SiO_xN_y$, or combinations thereof and combinations with a hafnium-based material, which for instance may have a multi-layer structure in which adjacent layers may be made of different materials; the work function metal layer 164 may comprise a material selected from a group consisting of TiN, TiAlN, TaN and TaAlN or combinations thereof. The gate 160 may be a metal gate, but is preferably a poly-silicon gate for the purpose of processing control. A mask layer is sandwiched between the second sidewall 128 and the insulating via 124; a channel layer is sandwiched between the second sidewall 128 and the epitaxial layer; in a direction perpendicular to the semiconductor substrate 100, the channel layer is sandwiched between the insulating layer 110 and the mask layer. In a direction perpendicular to the semiconductor substrate 100, the gates 160, the insulating via 124 and the sidewall spacer are at least higher than the channel layer and the epitaxial layer.

In one or more embodiments, the present invention further provides a method for manufacturing a semiconductor structure.

Figure 4:
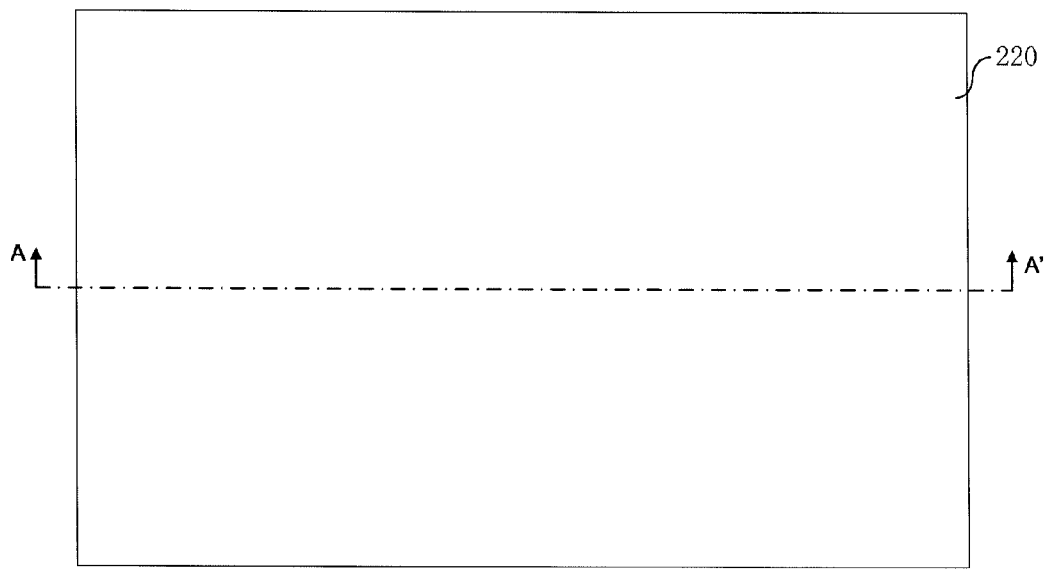
FIG. 4 and FIG. 5 illustrate an top view and a cross-sectional view along the section line AA' after respective material layers essential for manufacturing a semiconductor structure are formed on a substrate according to an embodiment of a method for manufacturing a semiconductor structure provided by an embodiment of the present invention.
Figure 5:
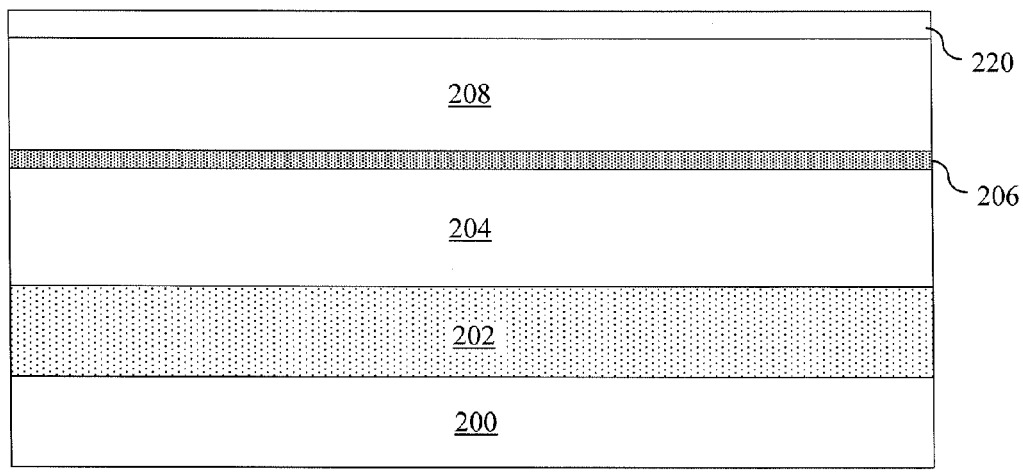
Figure 6:
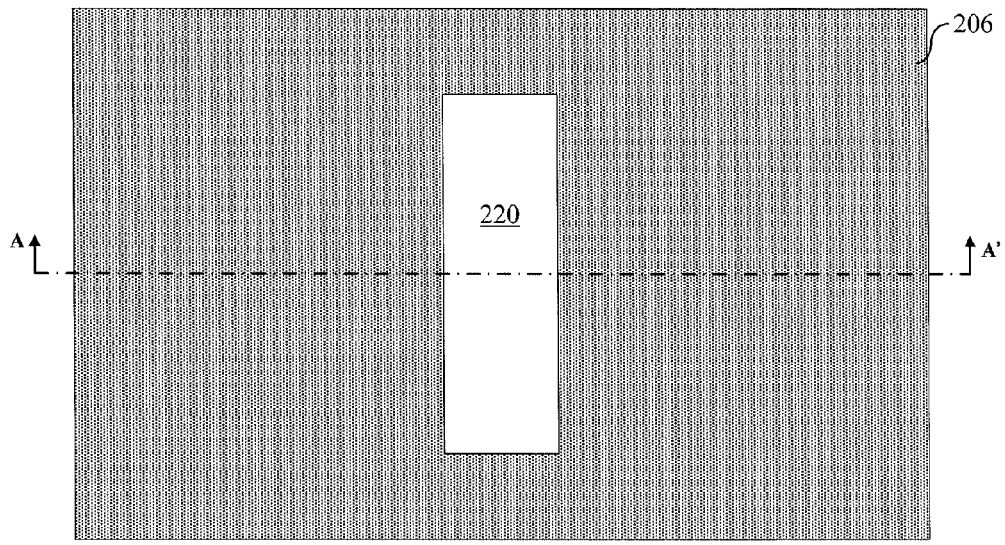
FIG. 6 and FIG. 7 illustrate respectively an top view and a cross-sectional view along the section line AA' after a protective layer and a sacrifice layer are patterned in an embodiment of the method for manufacturing the semiconductor structure provided by an embodiment of the present invention.
Figure 7:
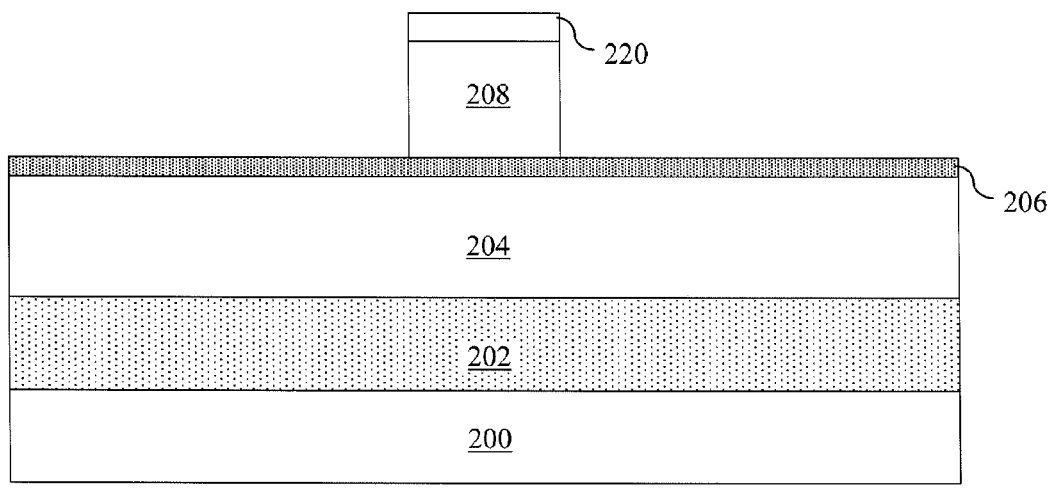
Figure 8:
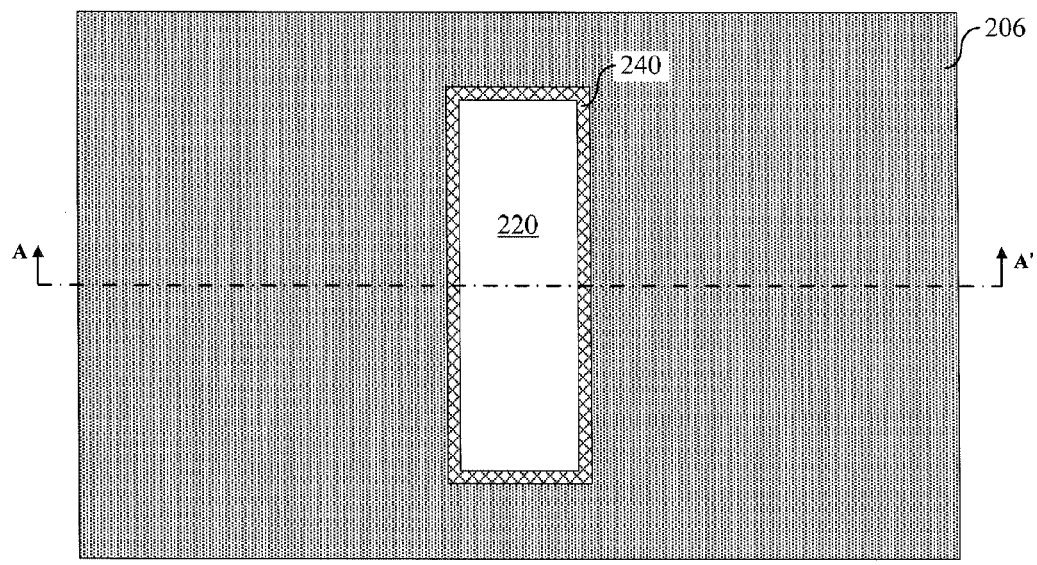
FIG. 8 and FIG. 9 illustrate respectively an top view and a cross-sectional view along the section line AA' after first sidewall spacers are formed in an embodiment of the method for manufacturing the semiconductor structure provided by an embodiment of the present invention.
Figure 9:
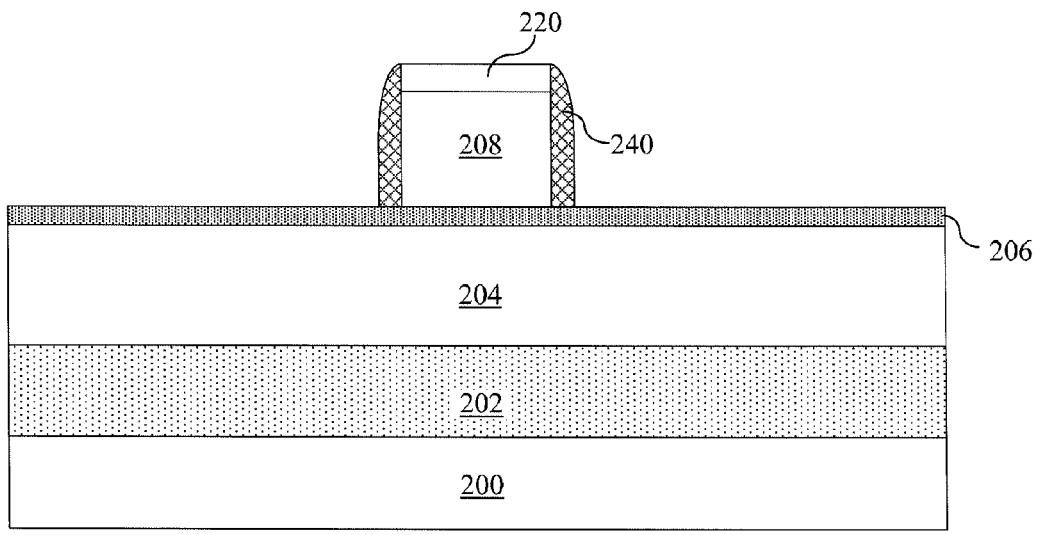

First, as shown in FIG. 4 and FIG. 5, a stop layer 206 (which may be $SiO_2$), a sacrifice layer 208 (which may be amorphous Si) and a protective layer 220 (which may be Si:C) are formed sequentially on Silicon-on-Insulator (SOI) (the Si layer is namely the first semiconductor layer, which is also may be made of other semiconductor materials; the SOI is composed of an insulating layer 202 and a Si layer 204 formed sequentially on a substrate 200; the substrate 200 is preferably a Si substrate); next, as shown in FIG. 6 and FIG. 7, the protective layer 220 and the sacrifice layer 208 are patterned, which may be implemented by means of etching process; and the etching process is terminated at the stop layer 206. Then, as shown in FIG. 8 and FIG. 9, first sidewall spacers 240 are formed to surround the patterned protective layer 220 and sacrifice layer 208, and the material of the first sidewall spacer 240 may be $Si_3N_4$; and the first sidewall spacers 240 may be formed by means of etching back process. Wherein, the first sidewalls may be perpendicular to the second sidewalls.

Figure 10:
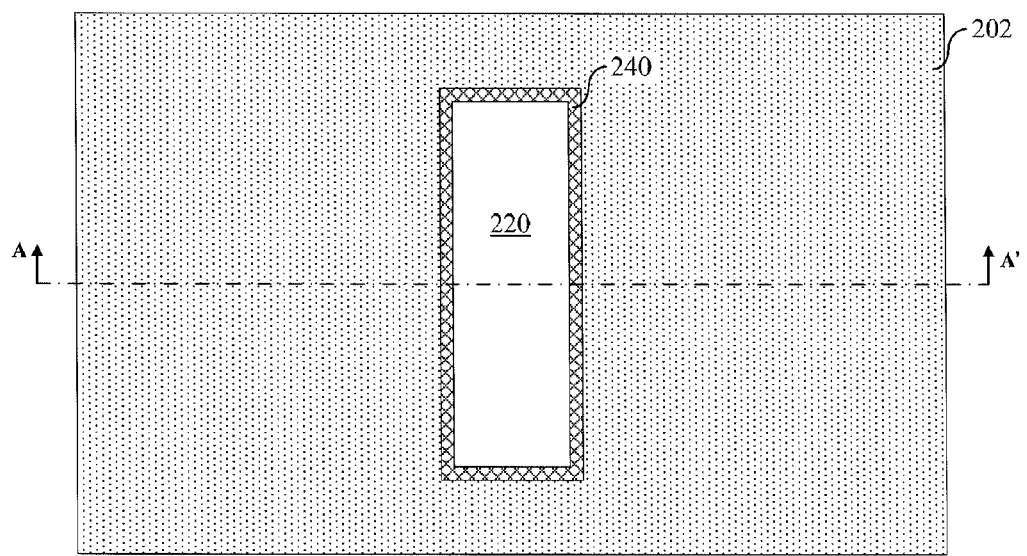
FIG. 10 and FIG. 11 illustrate respectively an top view and a cross-sectional view along the section line AA' after a stop layer and a silicon layer are patterned in an embodiment of the method for manufacturing the semiconductor structure provided by an embodiment of the present invention.
Figure 11:
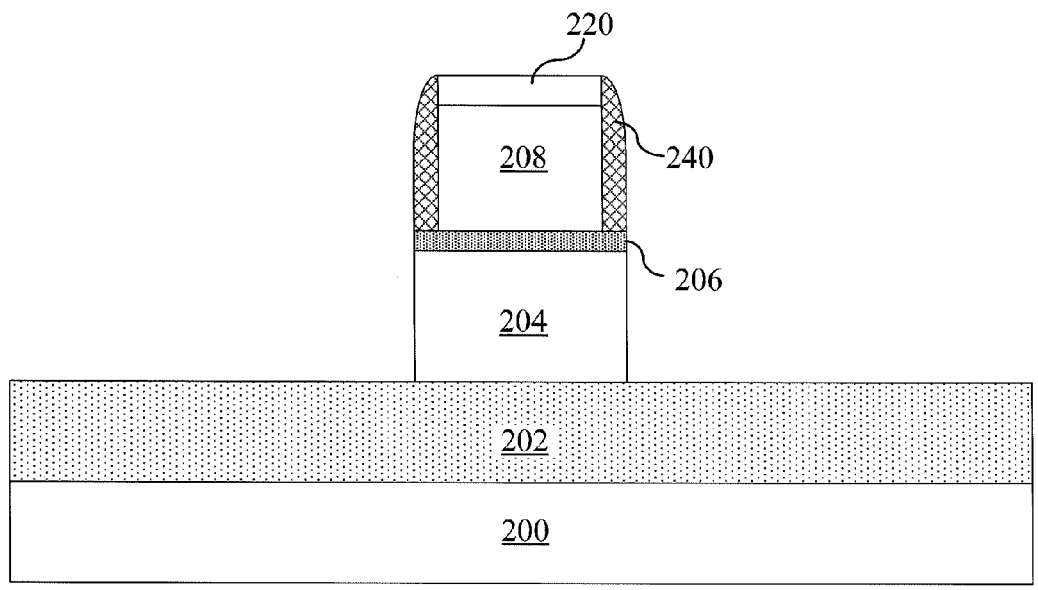
Figure 12:
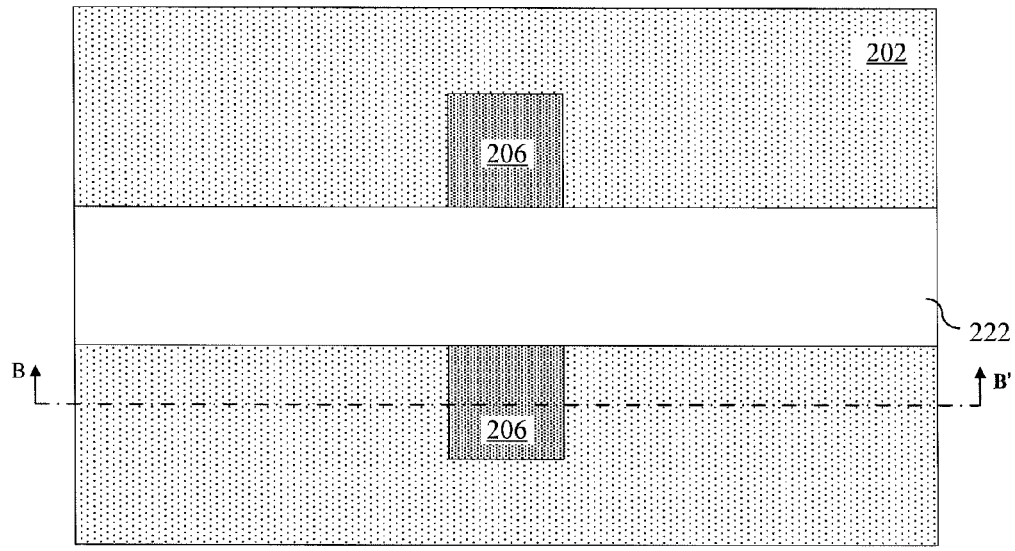
FIG. 12 and FIG. 13 illustrate respectively an top view and a cross-sectional view along the section line BB' after stop layers at source and drain regions are exposed in an embodiment of the method for manufacturing the semiconductor structure provided by an embodiment of the present invention.
Figure 13:
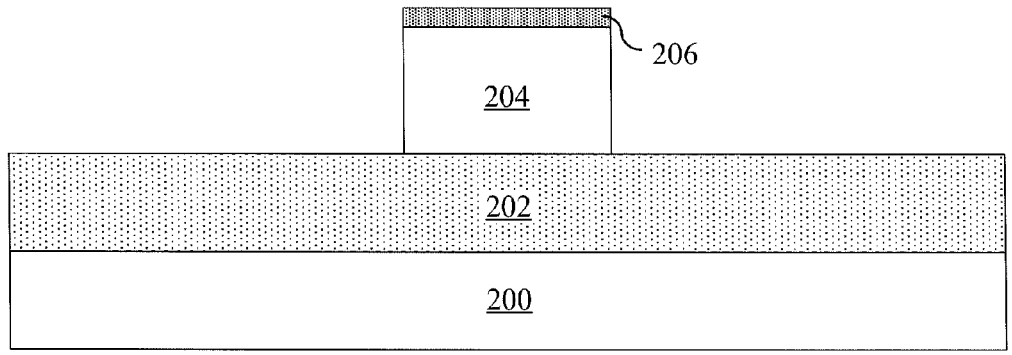
Figure 14:
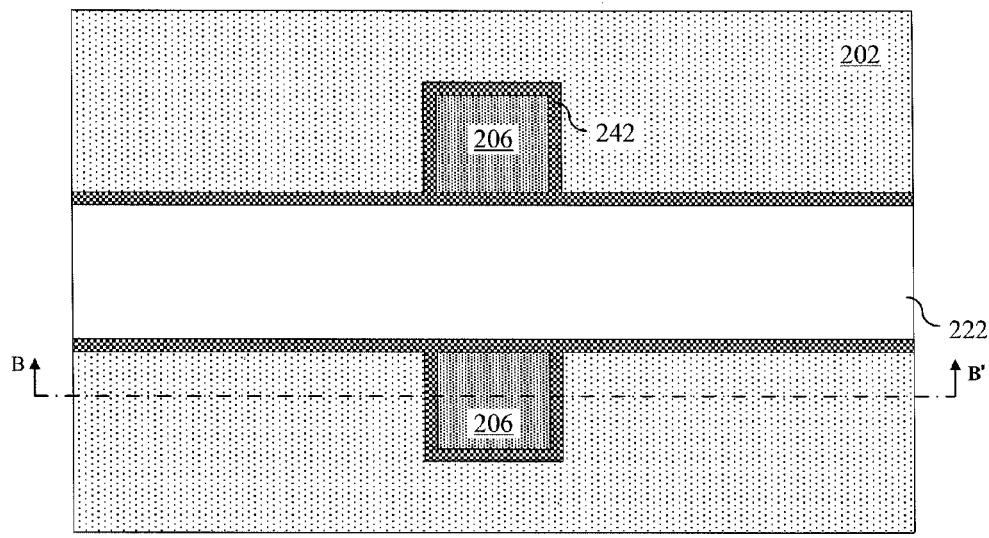
FIG. 14 and FIG. 15 illustrate respectively an top view and a cross-sectional view along the section line BB' after second sidewall spacers are formed in an embodiment of the method for manufacturing the semiconductor structure provided by an embodiment of the present invention.
Figure 15:
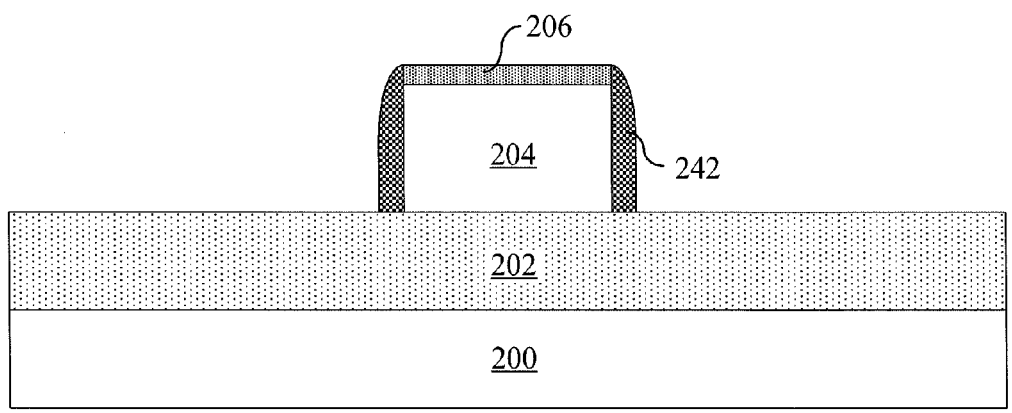

Wherein, the thickness of the Si layer 204 may be 50~100 nm, for example, 60 nm, 70 nm, 80 nm or 90 nm; the thickness of the stop layer 206 may be 5 nm~20 nm, for example, 8 nm, 10 nm, 15 nm or 18 nm; the thickness of the sacrifice layer 208 may be 30 nm~80 nm, for example, 40 nm, 50 nm, 60 nm or 70 nm; the thickness of the protective layer 220 may be 20~50 nm, for example, 25 nm, 30 nm, 35 nm or 40 nm; in a direction perpendicular to the second sidewalls, the thickness of the first sidewall spacers 240 may be 5 nm~40 nm, for example, 10 nm, 20 nm, 25 nm or 30 nm Next, as shown in FIG. 10 and FIG. 11, the stop layer 206 and the Si layer 204 are patterned with the first sidewall spacers 240 functioning as masks; the patterning operation may be implemented by means of etching process, and the etching process is terminated at the insulating layer 202. Then, as shown in FIG. 12 and FIG. 13, source/drain regions are determined and the first sidewall spacers 240, the protective layer 220 and the sacrifice layer 208, which cover aforesaid regions, are removed so as to expose the stop layer 206 (a hard mask 222 may be formed on other regions than on the source/drain regions, wherein the hard mask 222 may be positioned on the protective layer 220 in aforesaid steps and may be removed in a step as appropriate, for example, after exposure of the stop layer 220 located within the source/drain regions); meanwhile, the sidewalls of the protective layer 220 and of the sacrifice layer 208, which are in contact with the source/drain regions, are exposed as well (not shown); further, as shown in FIG. 14 and FIG. 15, second sidewall spacers 242 (which may be $Si_3N_4$) are formed to surround the protective layer 220, the sacrifice layer 208, the patterned stop layer 206 and the silicon layer 204; as such, the semiconductor base is formed accordingly (in an embodiment of the method, the first sidewalls indicate such sidewalls that are exposed from removal of portions corresponding to source/drain regions). Wherein, the thickness of the second sidewall spacers 242 may be 7 nm~20 nm, for example, 10 nm, 15 nm or 18 nm Then, source/drain regions and gates of the semiconductor structure are formed. However, it should be noted that the gate (which is in fact a gate stack structure comprising the gate; the gate stack structure comprises a gate dielectric layer, a work function metal layer and a poly-Si layer that are laminated one by one; the poly-Si layer also may be replaced by stacked metal layers) may be formed after the stop layer and the Si layer have been patterned, and before the stop layers at the source and drain regions are exposed.

Figure 16:
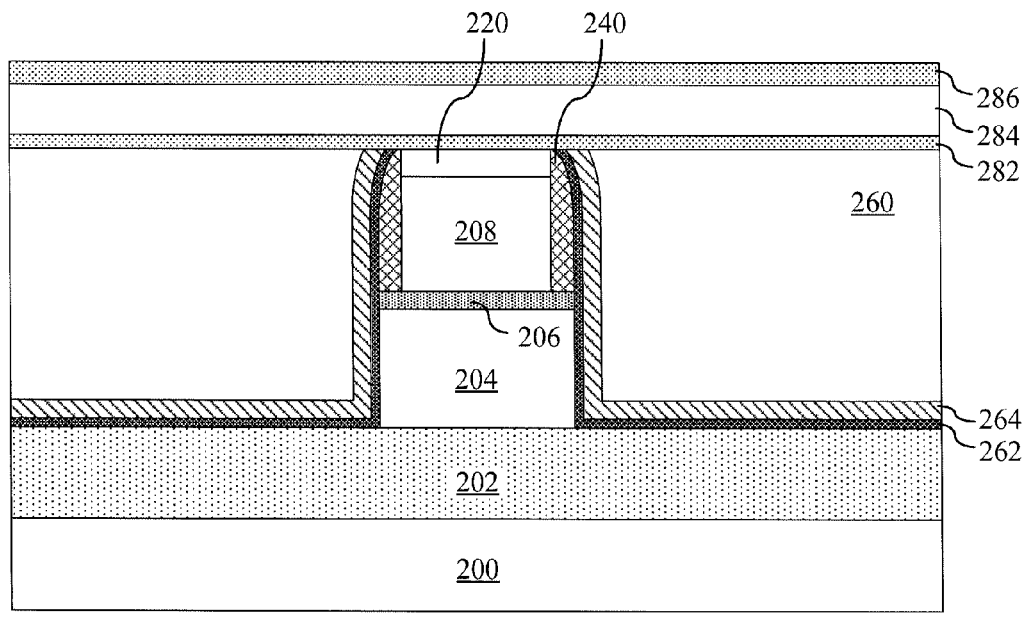
FIG. 16 illustrates a structural cross-sectional view of the structure with a gate stack structure formed after implementing of steps shown in FIG. 10 and FIG. 11 in an embodiment of the method for manufacturing the semiconductor structure provided by an embodiment of the present invention.

Specifically, as shown in FIG. 16, after the stop layer 206 and the Si layer 204 are patterned (as shown in FIG. 10 and FIG. 11), a gate stack structure is formed on the insulating layer 202 (wherein, the gate stack structure comprises a gate dielectric layer 262, a work function metal layer 264 and a gate material layer 260 that are laminated sequentially; wherein the gate dielectric layer 262 may be made of a hafnium-based material selected, for example, from a group consisting of $HfO_2$, HfSiO, HfSiON, HMO, HfTiO and HfZrO or combinations thereof, alternatively, or may be a material selected from a group consisting of $Al_2O_3$, $La_2O_3$, $ZrO_2$, $SiO_2$, $SiO_xN_y$, or combinations thereof, and combinations with a hafnium-based material; the work function metal layer 264 may comprise a material selected from a group consisting of TiN, TiAlN, TaN and TaAl or combinations thereof; the gate material layer 260 may be metal yet is preferably poly-silicon); next, the gate stack structure is planarized to expose the protective layer 220; then, an auxiliary mask layer is formed, and the auxiliary mask layer covers the gate stack structure and the protective layer 220; the auxiliary mask layer may be composed of laminated dielectric layers made of different materials; for example, in the case the material of the protective layer 220 and the first sidewall spacers 240 is $Si_3N_4$, the auxiliary mask layer may be a $SiO_2$ layer (a first auxiliary mask layer 282)-$Si_3N_4$ layer (a second auxiliary mask layer 284)-$SiO_2$ layer (a third auxiliary mask layer 286). After aforesaid operations have been implemented, only the $SiO_2$ layer may be seen under the top view of the substrate that carries aforesaid structure. Further, the auxiliary mask layer and the gate stack structure located within the source/drain regions have to be removed before formation of the semiconductor base. Aforesaid method for forming the gate is resulted from comprehensive consideration of integrating the overall manufacturing process, which is also the foundation for the following description. However, it should be noted that the gate may be formed according to other methods, and the gate also may be formed after formation of the source and drain regions. According to the teaching of embodiments of the present invention, a person of ordinary skills in the art is able to form the gate flexibly, thus the description is not given at length here in order not to obscure.

Wherein, the thickness of the gate dielectric layer 262 may be 2 nm~3 nm, for example, 2.5 nm; besides, an interface oxide layer may be further formed before formation of the gate dielectric layer 262, and the thickness of the interface oxide layer may be 0.2 nm~0.7 nm, for example, 0.5 nm (not shown); the thickness of the work function metal layer 264 may be 3 nm~10 nm, for example, 5 nm or 8 nm; the thickness of the gate material layer 260 may be 50 nm~100 nm, for example, 60 nm, 70 nm, 80 nm or 90 nm; the thickness of the first auxiliary mask layer 282 may be 2 nm~5 nm, for example 3 nm or 4 nm; the thickness of the second auxiliary mask layer 284 may be 10 nm~20 nm, for example, 12 nm, 15 nm or 18 nm; and the thickness of the third auxiliary mask layer 286 may be 10 nm~20 nm, for example, 12 nm, 15 nm or 18 nm; and the thickness of the source/drain base layers may be 5 nm~20 nm, for example 10 nm or 15 nm.

Figure 17:
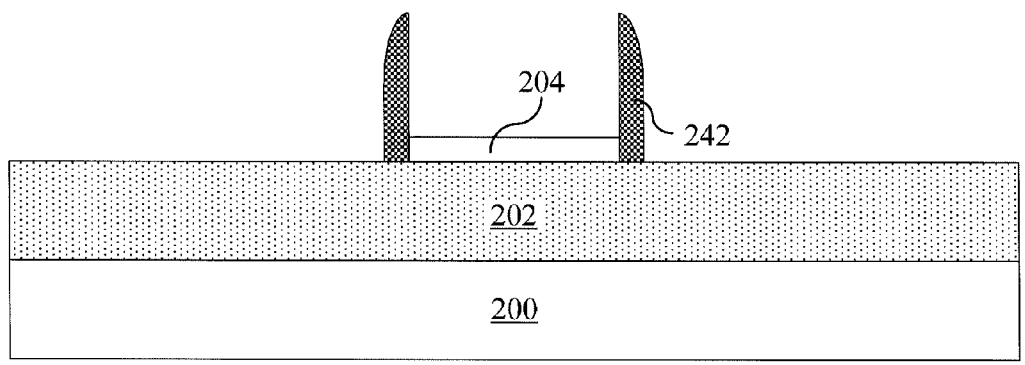
FIG. 17 illustrates a structural cross-sectional view after formation of source/drain base layers at source/drain regions in an embodiment of the method for manufacturing the semiconductor structure provided by an embodiment of the present invention.
Figure 18:
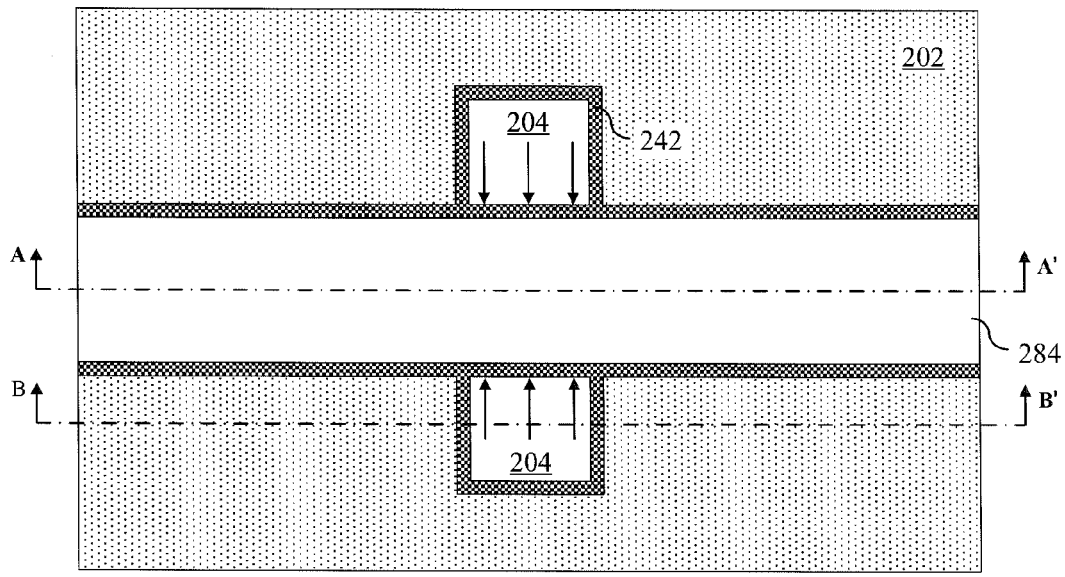
FIG. 18 illustrates an top view of performing ion implantation after formation of the source and drain base layers in an embodiment of the method for manufacturing the semiconductor structure provided by an embodiment of the present invention.
Figure 19:
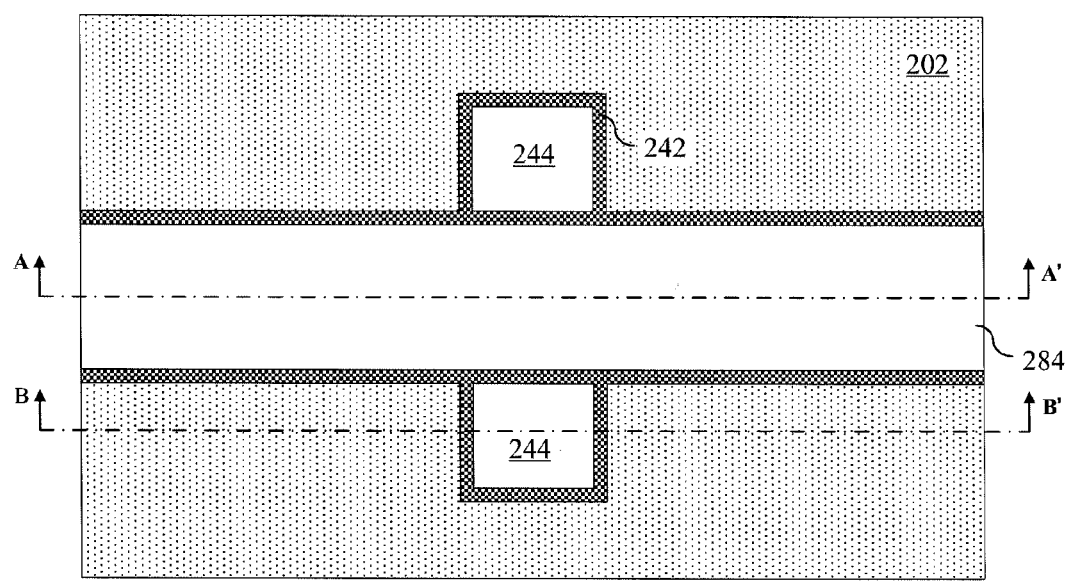
FIG. 19 and FIG. 20 illustrate respectively an top view and a cross-sectional view along the section line BB' after formation of second semiconductor layers on source/drain base layers in an embodiment of the method for manufacturing the semiconductor structure provided by an embodiment of the present invention.
Figure 20:
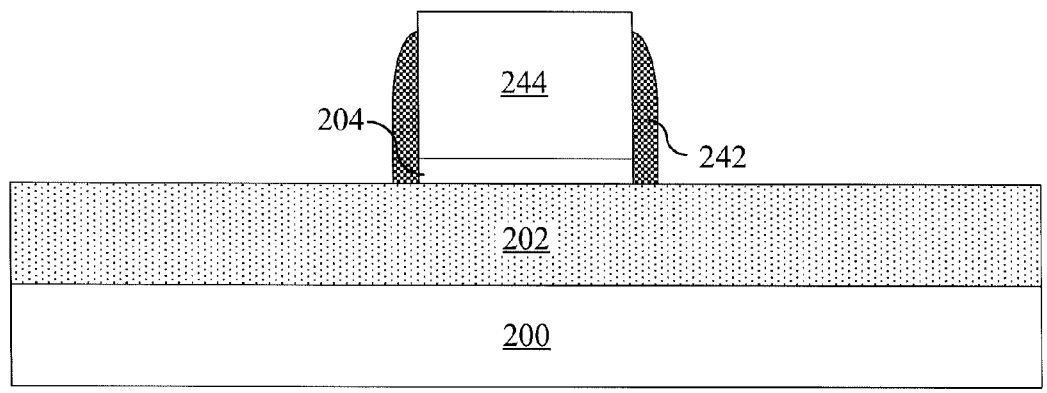

In practice, as shown in FIG. 17, after the semiconductor substrate has been formed, the stop layer 206 and part of the Si layer 204 located at the source and drain regions are removed (in this case, the first auxiliary mask 286 located on the gate stack structure, i.e. the $SiO_2$ layer, is also removed), so as to form source and drain base layers (i.e. semiconductor auxiliary bases); then, as shown in FIG. 18, ion implantation is performed along a direction (as denoted by arrows in the drawings) perpendicular to the first sidewalls (which indicates the surface of the Si layer exposed from removal of the Si layer of certain thickness), such that diffusion regions and halo regions are formed in the Si layer 204. As compared to ion implantation performed along a direction perpendicular to the second sidewalls in the prior art, embodiments of the present invention are more practical and is also favorable for reducing the distance between neighboring semiconductor bases, reducing areas of devices utilized and reducing manufacturing cost as well. All specific processes of ion implantation, such as implantation energy, implantation dose, doping particles and the number of times of implantation, may be regulated flexibly according to product designs and thus are not described at length in order not to obscure. Then, as shown in FIG. 19 and FIG. 20, the source and drain regions may be formed after second semiconductor layers 244 are formed on the source and drain base layers by means of epitaxial method (for PMOS devices, the material of the second semiconductor layers 244 may be $Si_{1-x}Ge_x$, and the doping concentration may be $1\times10^{19}$~$1\times10^{21}$ $cm^{-3}$; for NMOS devices, the material of the second semiconductor layers 244 may be Si:C and the doping concentration may be $1\times10^{19}$~$1\times10^{21}$ $cm^{-3}$). The source and drain regions are used to further adjust stress in channel regions, thereby improving carrier mobility in channel regions. Additionally, the source and drain regions also may be formed by way of performing ion implantation onto the Si layer 204 instead of removing part of the Si layer 204, after removal of the stop layers 206 located at the source and drain regions.

Figure 21:
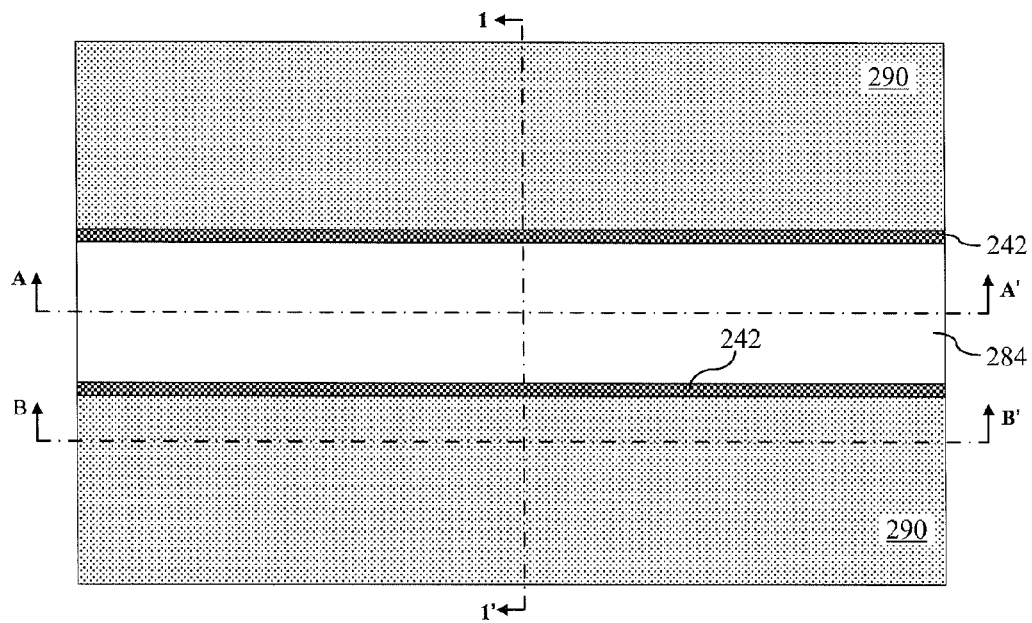
FIG. 21 and FIG. 22 illustrate respectively an top view and a cross-sectional view along the section line BB' after formation of a planarized first dielectric layer in an embodiment of the method for manufacturing the semiconductor structure provided by an embodiment of the present invention.
Figure 22:
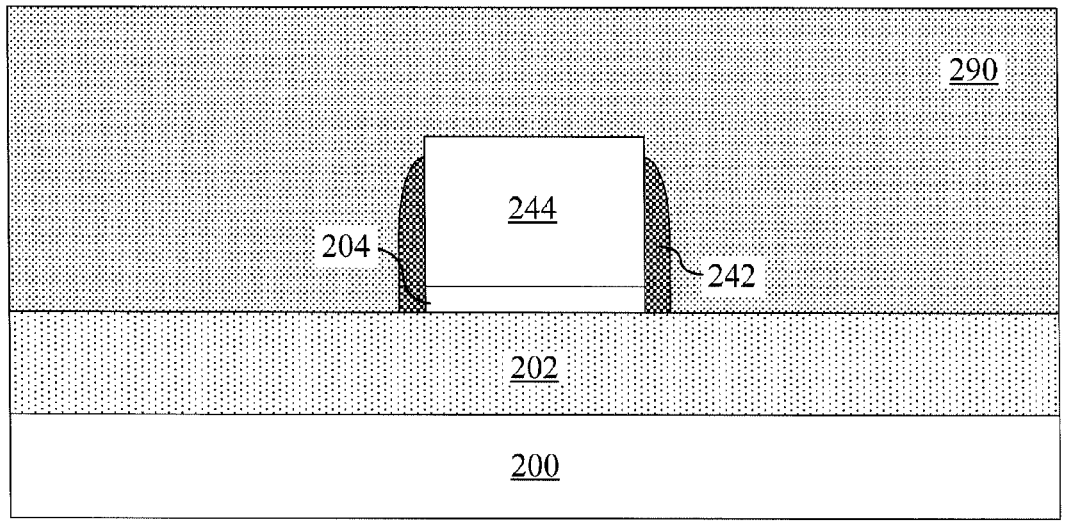
Figure 23:
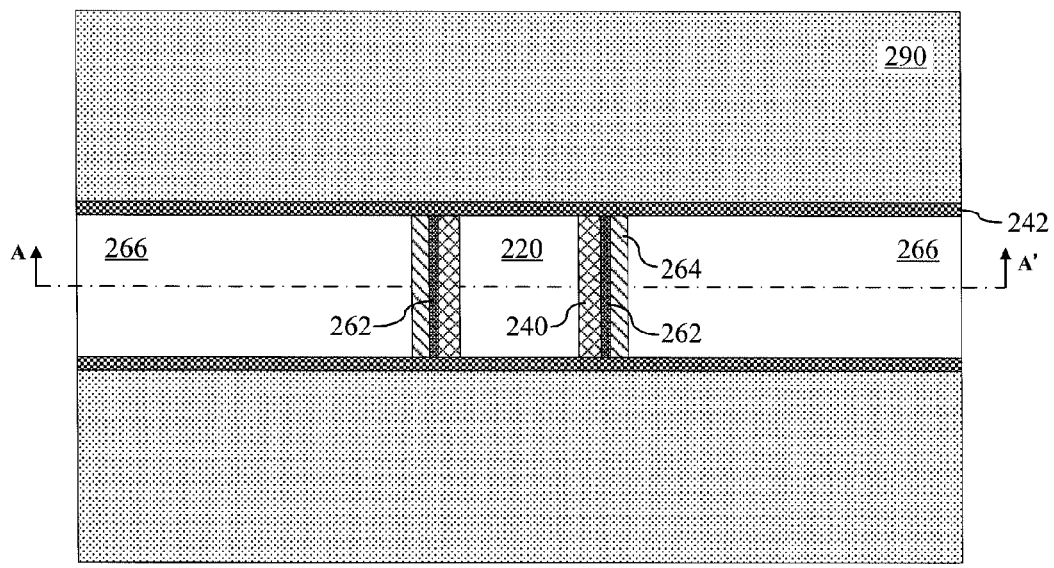
FIG. 23 and FIG. 24 illustrate respectively an top view and a cross-sectional view along the section line AA' after formation of a gate in an embodiment of the method for manufacturing the semiconductor structure provided by an embodiment of the present invention.
Figure 24:
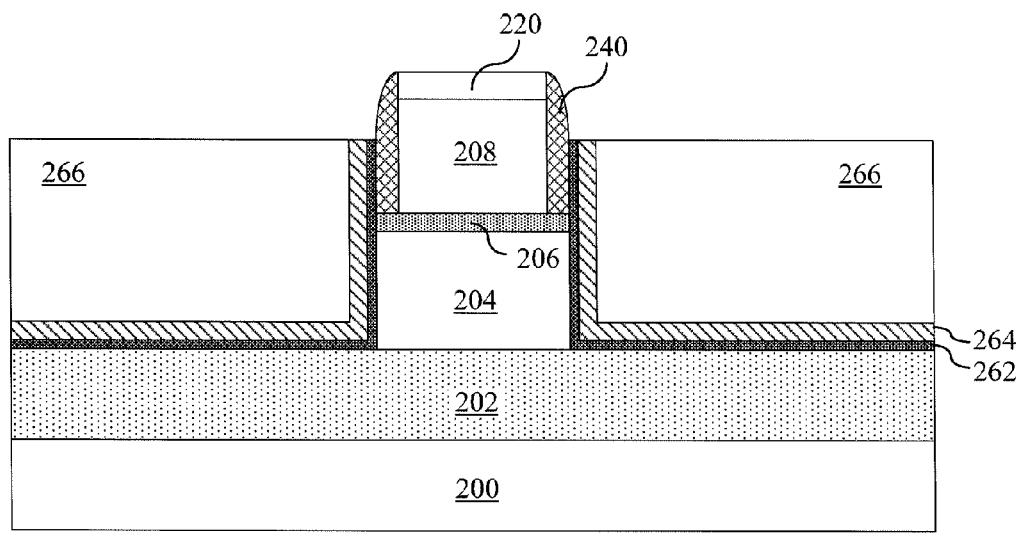
Figure 25:
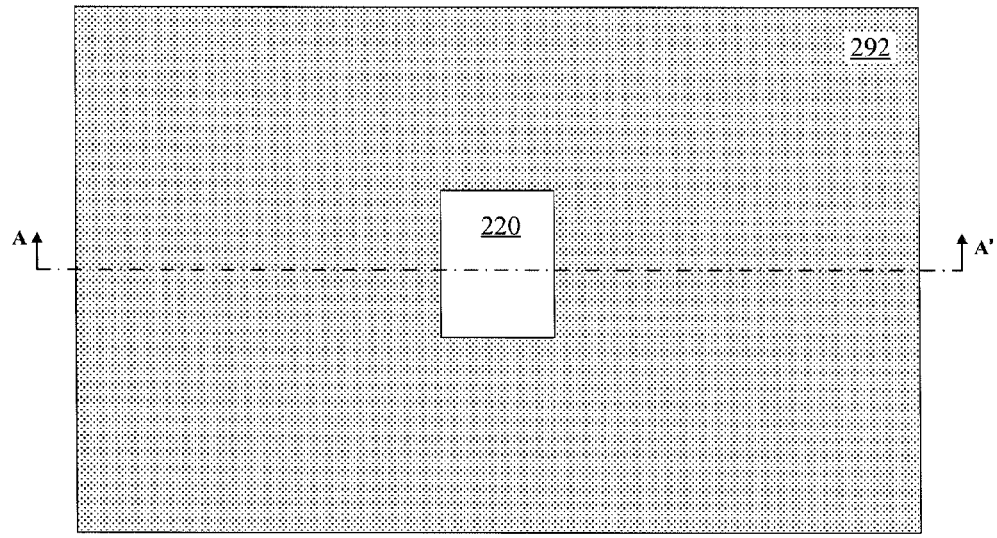
FIG. 25 and FIG. 26 illustrate respectively an top view and a cross-sectional view along the section line AA' after formation of a planarized second dielectric layer in an embodiment of the method for manufacturing the semiconductor structure provided by an embodiment of the present invention.
Figure 26:
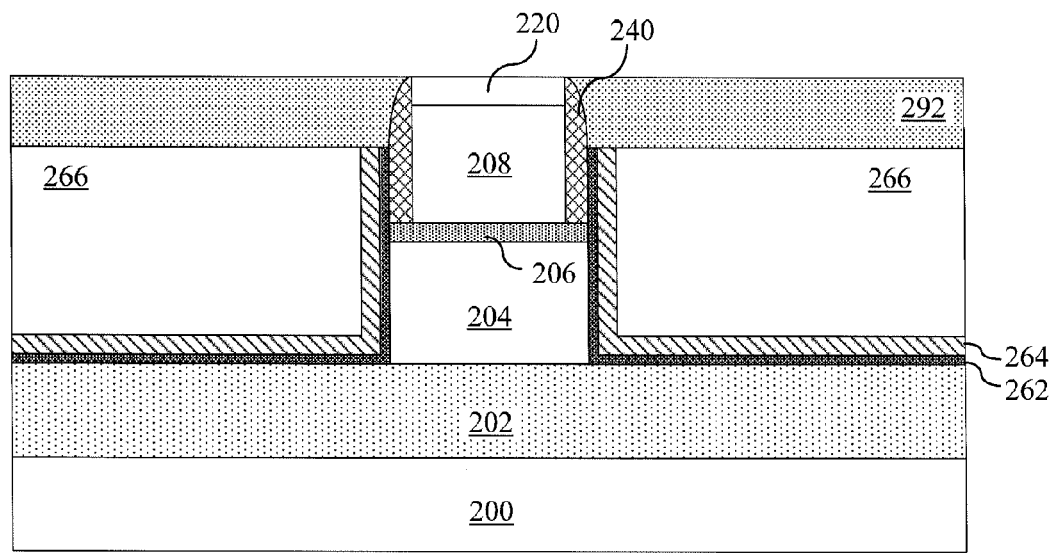
Figure 27:
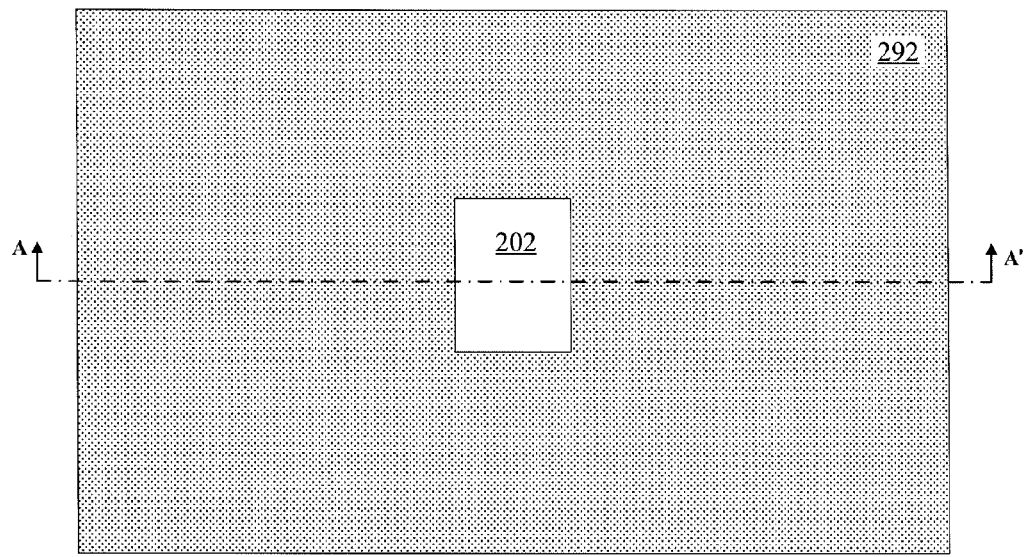
FIG. 27 and FIG. 28 illustrate respectively an top view and a cross-sectional view along the section line AA' after formation of a void in an embodiment of the method for manufacturing the semiconductor structure provided by an embodiment of the present invention.
Figure 28:
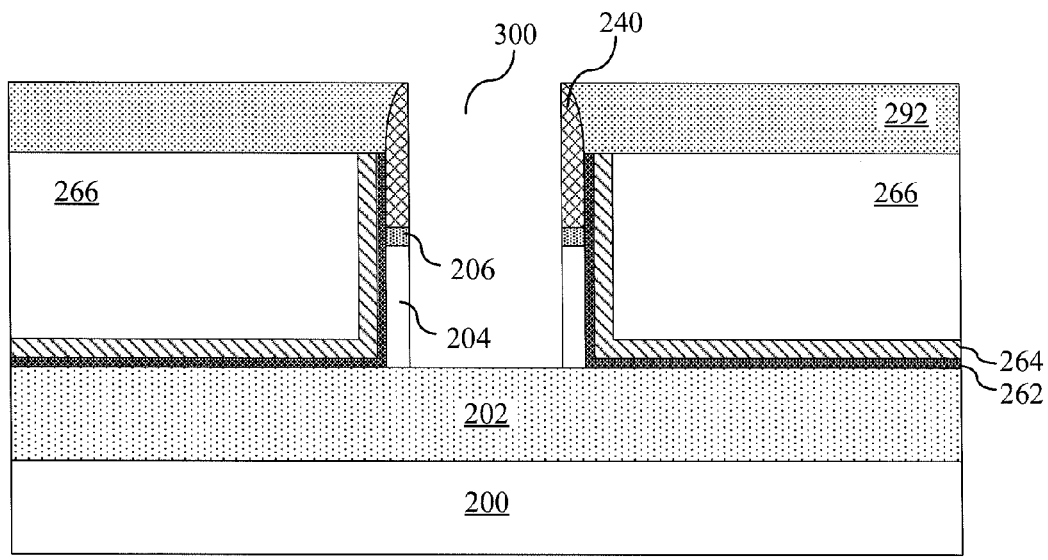

Next, a void 300 is formed; firstly, as shown in FIG. 21 and FIG. 22, a first dielectric layer 290 (e.g. $SiO_2$) is deposited and planarized so as to expose the second auxiliary mask layer 284; wherein, Chemical Mechanical Polish (CMP) may be implemented to expose the second auxiliary mask layer 284; then, as shown in FIG. 23 and FIG. 24, the second auxiliary mask layer 284 ($Si_3N_4$) and the first auxiliary mask layer 282 ($SiO_2$) and part of the gate stack structure are removed to form gates 266; in the direction of the thickness of the Si layer 204, the gates 266 are at least higher than the Si layer 204 (for the purpose of forming channels), so as to increase effective areas of channel regions in the device, thereby further improving carrier mobility in channel regions; and part of the protective layer 220 still remains after implementation of aforesaid operation. As further shown in FIG. 25 and FIG. 26, a second dielectric layer 292 is formed (e.g. SiO$_2$ for reducing damage of the structure readily built, when the protective layer 220 is to be removed to form the void); the second dielectric layer 292 exposes the protective layer 220 but covers the first sidewall spacers 240 and the second sidewall spacers 242; aforesaid operation may be implemented by way of depositing firstly the second dielectric layer 292 and then performing CMP to the second dielectric layer 292; then, as shown in FIG. 27 and FIG. 28, the protective layer 220, the sacrifice layer 208, the stop layer 206 and the Si layer 204 are removed with the second dielectric layer 292 functioning as a mask, so as to expose the insulating layer 202 and to form the void 300. It is noteworthy although it appears that other structures are not greatly affected at formation of the void 300 owing to protection provided by the second dielectric layer 292, yet the profile of the void 300 is determined owing to existence of the first sidewall spacers 240 and the second sidewall spacers 242; therefore, to certain extent, the first sidewall spacers 240 and the second sidewall spacers 242 also function as masks, which thus decrease the number of mask plates and are favorable for simplifying manufacturing processes. Since the void 300 is formed after formation of the source and drain regions, thus the source and drain regions no longer suffer from reaction force produced by the Si layer 204 (the first semiconductor layer), the stop layer 206 and the sacrifice layer 208 that are formerly fed into the void 300, such that the stress loss at the source and drain regions becomes less.

Figure 29:
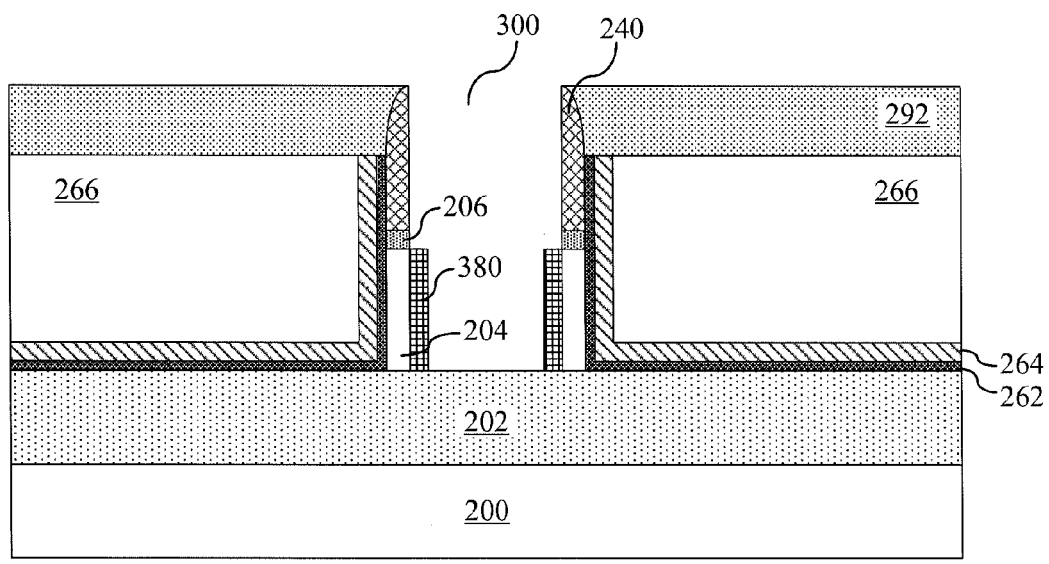
FIG. 29 illustrates a cross-sectional view of forming an epitaxial layer in the void in an embodiment of the method for manufacturing the semiconductor structure provided by an embodiment of the present invention.

Then, as shown in FIG. 29, after the void 300 has been formed, an epitaxial layer 380 is grown on the Si layer 204 on interior walls of the void by means of selective epitaxial method, meanwhile, in-situ doping is performed during implementing the epitaxial process. The thickness of the epitaxial layer 380 is 5 nm~40 nm, and the doping concentration is $5\times10^{18}$~$5\times10^{19}$ cm$^{-3}$, which as noted is quite higher than the doping concentration of the silicon layer 204 (which is used for providing channels), so as to form super-steep retrograde well. Specifically, for NMOS devices, the epitaxial layer is P-type doped; for PMOS devices, the epitaxial layer is N-type doped. It is favorable for thinning depletion regions, and suppressing short-channel effects. All specific processes of selective epitaxial growing process, such as processing temperature, reaction period and dopants may be regulated flexibly according to product designs and thus are not described at length in order not to obscure.

Figure 30:
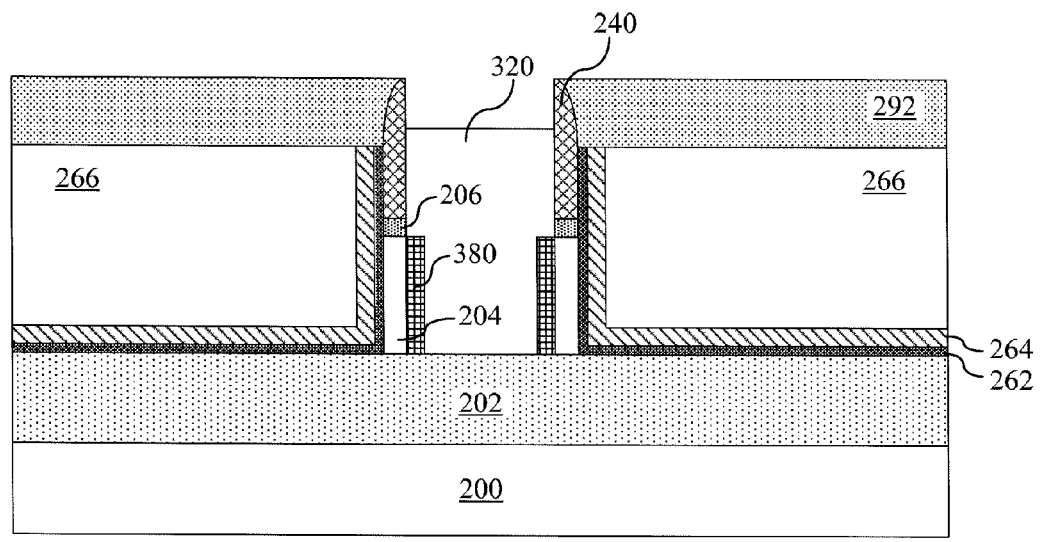
FIG. 30 illustrates a cross-sectional view after formation of an insulating via within the void in an embodiment of the method for manufacturing the semiconductor structure provided by an embodiment of the present invention.

Then, as shown in FIG. 30, an insulating material is filled into the void 300 through etching-back process so as to form an insulating via 320; the insulating via 320 may comprise a material selected from a group consisting of Si$_3$N$_4$, SiO$_2$ and SiO$_x$N$_y$ or combinations thereof. As the stress of the insulating via 320 is adjusted, for example PMOS devices have a tensile stress and NMOS devices have a compressive stress, the stress of the insulating via acts upon semiconductor base thereof and produces an opposite stress in the semiconductor bases, namely, a compressive stress is produced in the semiconductor base of PMOS devices, and a tensile stress is produced in the semiconductor base of NMOS devices. This is favorable for further adjusting the stress at channel regions, and thereby further improving carrier mobility within channel regions. It is also favorable for providing stress uniformly to channel regions of the devices by arranging the insulating via 320 at least higher than the patterned first semiconductor layer. So far, the semiconductor structure is formed.

Figure 31:
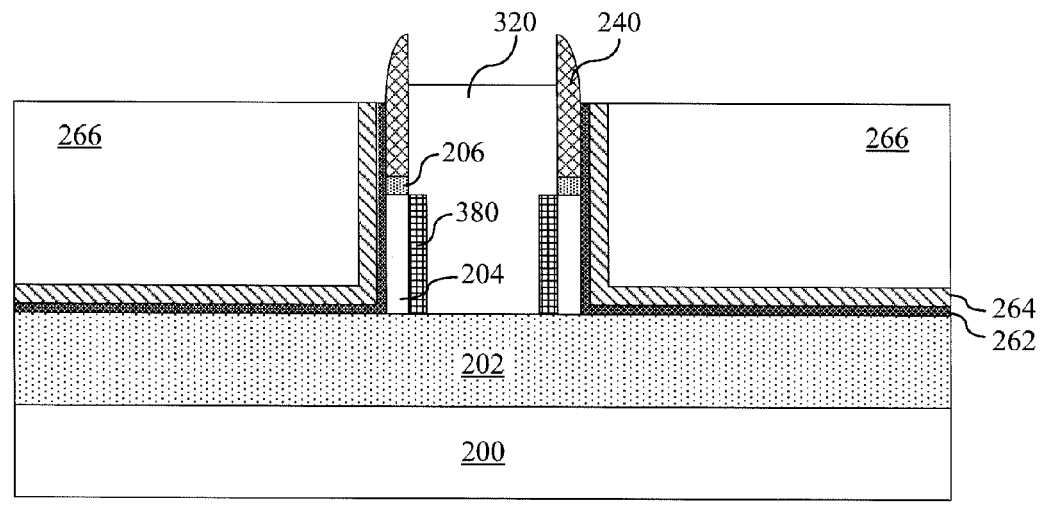
FIG. 31 and FIG. 32 illustrate cross-sectional views of gates and source/drain regions exposed from removal of the second dielectric layer in an embodiment of the method for manufacturing the semiconductor structure provided by an embodiment of the present invention.
Figure 32:
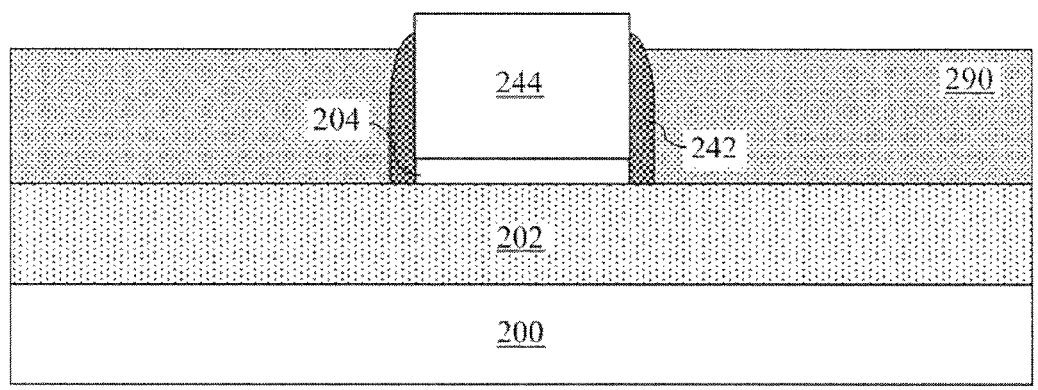
Figure 33:
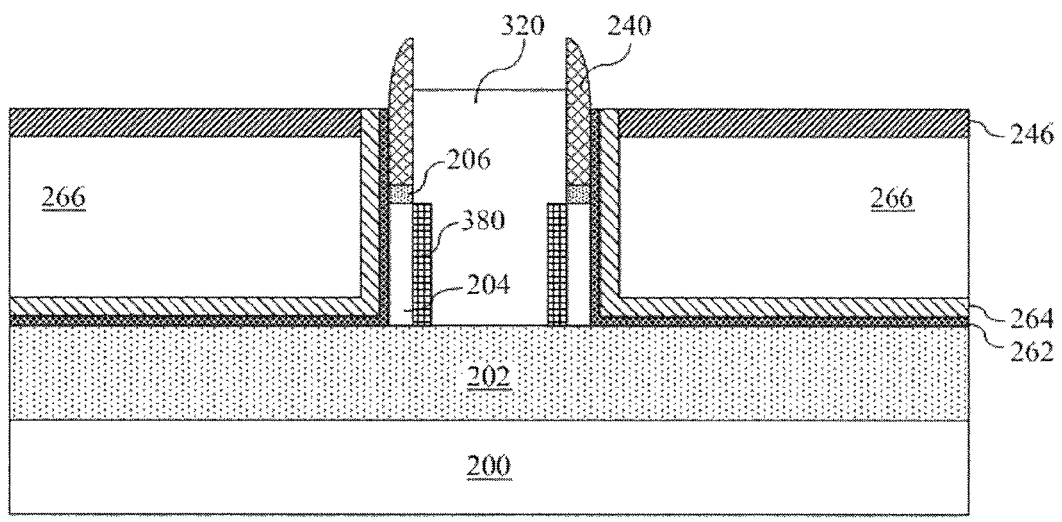
FIG. 33 and FIG. 34 illustrate cross-sectional views after formation of contact regions on gates and source/drain regions in an embodiment of the method for manufacturing the semiconductor structure provided by an embodiment of the present invention.
Figure 34:
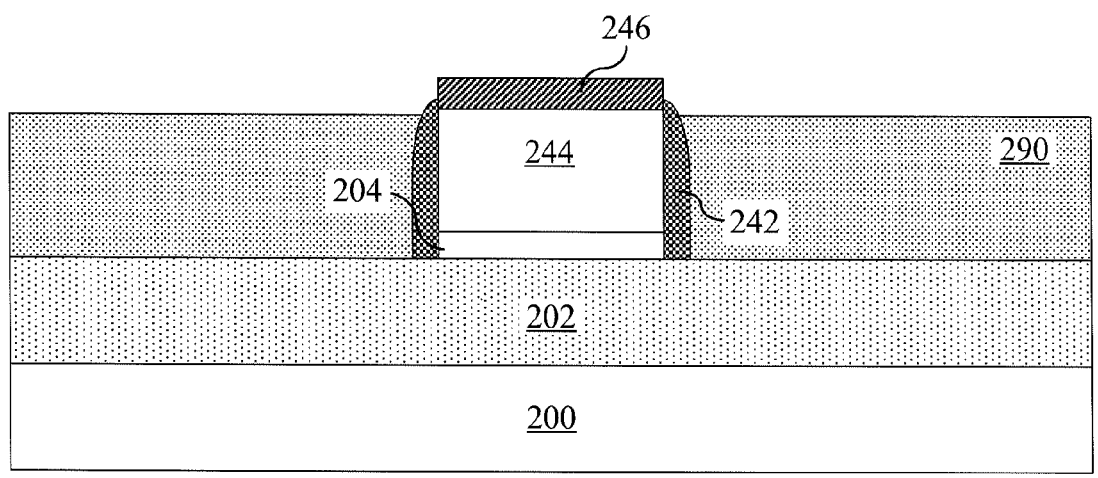

Then, as shown in FIG. 31 and FIG. 32, the second dielectric layer 292 is removed to expose the gates 266 and the source/drain regions 244; as further shown in FIG. 33 and FIG. 34, metal silicide layers 246 (i.e. contact regions for reducing the contact resistance at the time of forming metal interconnect later) may be formed on the gates 266 and the source/drain regions 244 by way of depositing metal layers on the gate 266 and the source/drain regions 244 and performing thermal process thereto, and then further removing the metal layer that remains from said reaction.

Although the exemplary embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What that is claimed is:

1. A semiconductor structure, comprising:
 a semiconductor base located on an insulating layer, wherein the insulating layer is located on a semiconductor substrate;
 source and drain regions, which are in contact with first sidewalls of the semiconductor base opposite to each other;
 gates located on second sidewalls of the semiconductor base opposite to each other;
 an insulating via located on the insulating layer and embedded into the semiconductor base; and
 an epitaxial layer sandwiched between the insulating via and the semiconductor base.

2. The semiconductor structure according to claim 1 further comprising a channel layer, wherein the channel layer is sandwiched between the second sidewall and the epitaxial layer.

3. The semiconductor structure according to claim 2 further comprising a mask layer sandwiched between the second sidewall and the insulating via, wherein the channel layer is sandwiched between the second sidewall and the mask layer in a direction perpendicular to the semiconductor substrate.

4. The semiconductor structure according to claim 2, wherein the channel layer has a thickness between 5 nm~40 nm in a direction perpendicular to the second sidewalls.

5. The semiconductor structure according to claim 1, wherein the epitaxial layer has a thickness between 5 nm~40 nm in a direction perpendicular to the second sidewalls.

6. The semiconductor structure according to claim 1, wherein the doping concentration of the epitaxial layer is $5\times10^{18}$~$5\times10^{19}$ cm$^{-3}$.

7. The semiconductor structure according to claim 1, wherein the epitaxial layer has a thickness between 5 nm~40 nm in a direction perpendicular to the second sidewalls.

8. The semiconductor structure according to claim 1, wherein the epitaxial layer has a same doping type as that of the channel layer, the doping concentration of the epitaxial layer is greater than that of the channel layer, for NMOS devices, the doping type of the epitaxial layer is P-type, and for PMOS devices, the doping type of the epitaxial layer is N-type.

9. The semiconductor structure according to claim 1, wherein the insulating via comprises a material selected from a group consisting of $Si_3N_4$, $SiO_2$ and $SiO_xN_y$, or combinations thereof.

10. The semiconductor structure according to claim 1, wherein for NMOS devices, the insulating via comprises a compressive stress, and wherein for PMOS devices, the insulating via comprises a tensile stress.

11. The semiconductor structure according to claim 1, wherein the first sidewalls are perpendicular to the second sidewalls.

12. The semiconductor structure according to claim 1, further comprising a semiconductor auxiliary base, whose upper surface is lower than the upper surface of the semiconductor base; wherein the semiconductor auxiliary base is in contact with the first sidewalls, and the source/drain regions are formed on the semiconductor auxiliary base.

13. The semiconductor structure according to claim 12, wherein the semiconductor auxiliary base comprises Si; for PMOS devices, the source/drain regions comprise $Si_{1-x}Ge_x$, 0<x<1; for NMOS devices, the source/drain regions comprise Si:C.

14. The semiconductor structure according to claim 13, wherein in the $Si_{1-x}Ge_x$, the value of X is selected from the range of 0.1~0.7.

15. The semiconductor structure according to claim 13, wherein in the Si:C, the percentage of C atoms is in the range of 0.2%~2%.

16. The semiconductor structure according to claim 2, wherein the doping concentration of the epitaxial layer is $5\times10^{18}$~$5\times10^{19}$ $cm^{-3}$.

17. The semiconductor structure according to claim 2, wherein the epitaxial layer has a same doping type as that of the channel layer, the doping concentration of the epitaxial layer is greater than that of the channel layer, for NMOS devices, the doping type of the epitaxial layer is P-type, and for PMOS devices, the doping type of the epitaxial layer is N-type.

18. The semiconductor structure according to claim 2, wherein the gates and/or the insulating via are at least higher than the channel layer in a direction perpendicular to the semiconductor substrate.

19. The semiconductor structure according to claim 2, wherein the insulating via comprises a material selected from a group consisting of $Si_3N_4$, $SiO_2$ and $SiO_xN_y$, or combinations thereof.

20. The semiconductor structure according to claim 2, wherein for NMOS devices, the insulating via comprises a compressive stress, and wherein for PMOS devices, the insulating via comprises a tensile stress.

21. A method for manufacturing a semiconductor structure comprising the steps of:
forming an insulating layer on a semiconductor substrate;
forming a semiconductor base on the insulating layer;
forming source/drain regions that are in contact with first sidewalls of the semiconductor base opposite to each other;
forming gates located on second sidewalls of the semiconductor substrate opposite to each other;
removing part of the semiconductor base to form a void inside the semiconductor base, wherein the void exposes the insulating layer;
forming an epitaxial layer inside the void by means of selective epitaxy; and
forming an insulating via in the void.

22. The method according to claim 21 further comprising;
in the step of forming the semiconductor base:
forming, on the insulating layer, a first semiconductor layer, a stop layer, a patterned sacrifice layer, a patterned protective layer and first sidewall spacers surrounding the patterned sacrifice layer and the protective layer;
forming a patterned stop layer and a first semiconductor layer with the first sidewall spacers functioning as masks;
determining source/drain regions and removing part of the first sidewall spacers, the protective layer and the sacrifice layer that cover the source/drain regions, so as to expose the stop layer; and
forming second sidewall spacers to surround the protective layer, the sacrifice layer;
in the step for forming the void in the semiconductor base:
removing the protective layer, the sacrifice layer and the first semiconductor layer with the first sidewall spacers and the second sidewall spacers functioning as masks, wherein the material of the stop layer is different from that of the protective layer, the sacrifice layer, the first semiconductor layer, the first sidewall spacers and the second sidewall spacers.

23. The method according to claim 21 further comprising:
in the step of forming the source/drain regions:
after formation of the semiconductor base, removing the stop layer and part of the first semiconductor layer located at the source/drain regions, so as to form source/drain base layers; and
forming a second semiconductor layer on the source/drain base layers.

24. The method according to claim 23, wherein the first semiconductor layer comprises Si; for PMOS devices, the semiconductor layer comprises $Si_{1-x}Ge_x$, 0<X<1; for NMOS devices, the second semiconductor layer comprises Si:C.

25. The method according to claim 24, wherein in the $Si_{1-x}Ge_x$, the value of X is selected from the range of 0.1~0.7.

26. The method according to claim 24, wherein in the Si:C, the percentage of C atoms is in the range of 0.2%~2%.

27. The method according to claim 21, wherein prior to formation of the second semiconductor layer on the source/drain base layers, further comprising: performing ion implantation along a direction perpendicular to the first sidewalls, so as to form diffusion regions and Halo regions.

28. The method according to claim 22, wherein the step of forming the gate further comprises:
forming a gate stack structure before determination of the source/drain regions, wherein the gate stack structure is at least higher than the patterned first semiconductor layer in a direction perpendicular to the semiconductor substrate.

29. The method according to claim 22, wherein the first sidewall spacers have a thickness between 5 nm~40 nm in a direction perpendicular to the second sidewalls.

30. The method according to claim 21, wherein the insulating via is at least higher than the patterned first semiconductor layer in a direction perpendicular to the semiconductor substrate.

31. The method according to claim 21, wherein the doping concentration of the epitaxial layer is $5\times10^{18}$~$5\times10^{19}$ $cm^{-3}$.

32. The method according to claim 31, wherein the epitaxial layer has a same doping type as that of the first semiconductor layer, the doping concentration of the epitaxial layer is greater than that of the first semiconductor layer, for NMOS devices, the doping type of the epitaxial layer is P-type, and for PMOS devices, the doping type of the epitaxial layer is N-type.

33. The method according to claim 22, wherein in a direction perpendicular to the second sidewalls, the epitaxial layer is at least formed on one interior wall of the void, and the epitaxial layer at least covers the patterned first semiconductor layer.

34. The method according to claim 21, wherein the epitaxial layer has a thickness between 5 nm~40 nm in a direction perpendicular to the second sidewalls.

35. The method according to claim 21, wherein the first sidewalls are perpendicular to the second sidewalls.

36. The method according to claim 21, wherein the insulating via comprises a material selected from a group consisting of $Si_3N_4$, $SiO_2$ and $SiO_xN_y$, or combinations thereof.

37. The method according to claim 21, wherein for NMOS devices, the insulating via comprises a compressive stress, and wherein for PMOS devices, the insulating via comprises a tensile stress.

* * * * *